(12) United States Patent
Ito et al.

(10) Patent No.: US 6,780,679 B2
(45) Date of Patent: Aug. 24, 2004

(54) SEMICONDUCTOR DEVICE AND METHOD OF MANUFACTURING THE SAME

(75) Inventors: Fujio Ito, Hanno (JP); Hiromichi Suzuki, Tokyo (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/322,435

(22) Filed: Dec. 19, 2002

(65) Prior Publication Data

US 2003/0178723 A1 Sep. 25, 2003

(30) Foreign Application Priority Data

Mar. 20, 2002 (JP) ........................................ 2002-077740

(51) Int. Cl.[7] .......................... H01L 21/44; H01L 21/48
(52) U.S. Cl. ...................... 438/123; 438/112; 438/113; 438/118; 438/126; 438/127
(58) Field of Search ................................ 438/106, 107, 438/110–114, 118, 123, 125–127; 257/685, 687, 690, 691, 692

(56) References Cited

U.S. PATENT DOCUMENTS

| | | | | |
|---|---|---|---|---|
| 5,157,480 A | * | 10/1992 | McShane et al. | ............ 257/693 |
| 6,365,980 B1 | * | 4/2002 | Carter et al. | ................. 257/787 |
| 6,399,423 B2 | | 6/2002 | Matsuura et al. | ............ 438/123 |
| 6,427,976 B1 | * | 8/2002 | Huang et al. | ................. 257/676 |
| 6,437,429 B1 | * | 8/2002 | Su et al. | ....................... 257/666 |
| 6,563,209 B1 | * | 5/2003 | Takahashi | .................... 257/692 |

FOREIGN PATENT DOCUMENTS

| | | |
|---|---|---|
| JP | 2000-100843 | 4/2000 |
| JP | 2000-286372 | 10/2000 |
| JP | 3072291 | 11/2000 |
| JP | 2001-024135 | 1/2001 |
| JP | 2001-189410 | 7/2001 |

* cited by examiner

*Primary Examiner*—Hung Vu
(74) *Attorney, Agent, or Firm*—Antonelli, Terry, Stout & Kraus, LLP

(57) ABSTRACT

The mounting reliability of a QFN (Quad Flat Non-leaded package) having a large number of pins is improved, and also the manufacturing cost of the QFN having a large number of pins is reduced. A die pad, on which a semiconductor die is mounted, is arranged at the center of a plastic package constituting a package of the QFN. A plurality of leads are arranged around the die pad so as to surround the die pad. Lead tips on one side near the semiconductor die are electrically connected to bonding pads on a main surface of the semiconductor die via gold wires, and lead tips on the other side terminate at a side surface of the plastic package. On a rear surface of the plastic package, external connection terminals formed by pressing and bending the respective parts of the plurality of leads protrude to the outside, and a solder layer is formed on each surface of the terminals.

6 Claims, 28 Drawing Sheets

OUTWARD APPEARANCE OF QFN (SURFACE SIDE)

OUTWARD APPEARANCE OF QFN (REAR SURFACE SIDE)

INTERNAL STRUCTURE OF
QFN (SURFACE SIDE)

INTERNAL STRUCTURE OF QFN (REAR SURFACE SIDE)

FIG. 11
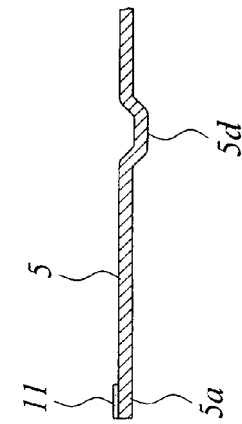
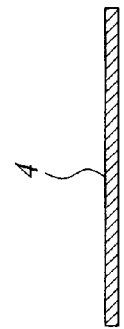
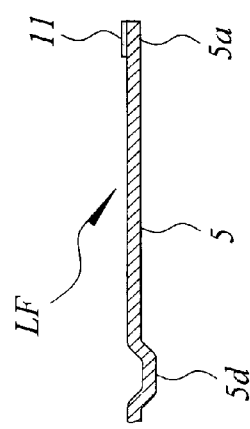

SEMICONDUCTOR DEVICE AND METHOD OF MANUFACTURING THE SAME

BACKGROUND OF THE INVENTION

The present invention relates to a semiconductor device and a manufacturing method of the same, and, more particularly, to a technique effectively applied to a method of increasing the number of pins used in a resin-encapsulated semiconductor device.

A QFN (Quad Flat Non-leaded package) can be taken as an example of a resin package in which a semiconductor die mounted on a lead frame is encapsulated in a plastic package made of a molding resin.

The QFN has a structure in which: respective lead tips of a plurality of leads electrically connected to a semiconductor die via bonding wires are exposed from the rear surface (lower surface) of the peripheral portion of the plastic package to constitute terminals; and the bonding wires are connected to a surface opposite to the surface on which the terminals are exposed, more specifically, connected to the terminal surfaces inside the plastic package, thereby electrically connecting the terminals and the semiconductor die. The QFN is mounted by soldering these terminals to electrodes (footprint) on a wiring board. This structure has an advantage of the fact that the size of a mounting area is reduced in comparison to a QFP (Quad Flat Package) in which leads transversely extend from the side surface of a package (plastic package) to constitute terminals.

The description of the above QFN is found in Japanese Patent Laid-Open No. 2001-189410 and Japanese Patent Publication No. 3072291, etc.

SUMMARY OF THE INVENTION

However, when it is intended to increase the number of terminals (increase of the number of pins) with higher function and performance of an LSI formed on the semiconductor die, the following problems arise in the QFN.

That is, since the bonding wires are connected to a surface opposite to the terminal surfaces exposed on the rear surface of the plastic package as described above, the interval between the terminals is equal to the interval between the bonding-wire connecting positions of the leads. In addition, it is impossible to reduce an area of the terminal too much because a predetermined are is necessary to ensure the reliability of the mounting.

Therefore, when it is intended to increase the number of pins without changing the size of the package, it is impossible to largely increase the number of pins because the number of terminals cannot be increased to such a degree. On the other hand, when it is intended to increase the number of pins by increasing the size of the package, the length between the semiconductor die and the bonding-wire connecting position becomes wider and the length of the bonding wire becomes longer. Therefore, there arises a problem of the short circuit between the adjoining wires in a wire bonding process and a resin molding process, or the like, which results in a decrease in the manufacturing yield.

Moreover, in the case where the semiconductor die is shrunk with an aim to reduce the manufacturing cost, the length between the semiconductor die and the bonding-wire connecting position becomes wider, whereby there arises also a problem of the fact that the connection by the use of the bonding wire cannot be made.

Also, when it is intended to increase the number of pins by increasing the size of the package, the warp of the package is also increased accordingly. Therefore, particularly, a lifetime of the connection between a terminal located in the peripheral portion of the package and the wiring board becomes shortened due to a temperature cycle or the like after mounting the package onto the wiring board.

An object of the present invention is to provide a technique capable of improving the mounting reliability of a QFN.

Another object of the present invention is to provide a technique capable of reducing the manufacturing cost of a QFN.

Another object of the present invention is to provide a technique capable of promoting an increase in the number of pins used in a QFN.

The above and other objects and novel characteristics of the present invention will be apparent from the description of this specification and the accompanying drawings.

The typical ones of the inventions disclosed in the present application will be briefly described as follows.

A semiconductor device according to the present invention has: a semiconductor die; a die pad on which said semiconductor die is mounted; a plurality of leads arranged around said semiconductor die; a plurality of wires for electrically connecting said semiconductor die and said leads; and a plastic package for encapsulating said semiconductor die, said die pad, said plurality of leads, and said plurality of wires, wherein said plurality of leads are formed so that intervals between lead tips on one side near said semiconductor die are narrower than those between lead tips on the other side opposite to said one side, and each of said plurality of leads is selectively provided with a terminal, which is formed by pressing and bending a part of each of said leads so as to protrude from a rear surface of said plastic package to the outside A method of manufacturing a semiconductor device according to the present invention includes the steps of:

(a) press-molding a metal sheet to prepare a lead frame, on which a pattern including said die pad and said plurality of leads is repeatedly formed and a terminal is formed on a surface of each of said plurality of leads so as to protrude in a direction perpendicular to said surface;

(b) mounting a semiconductor die, on each of said plurality of die pads formed on said lead frame, and connecting said semiconductor die and respective parts of said leads by wires;

(c) preparing a molding die having an upper die and a lower die, coating a surface of said lower die with a resin film, then mounting said lead frame on said resin film, and thereby contacting said resin film and said terminal formed on a surface of each of said leads;

(d) sandwiching said resin film and said lead frame between said upper die and said lower die to push a tip portion of said terminal into said resin film;

(e) injecting a resin into a gap between said upper die and said lower die to form a plurality of plastic packages, in which said semiconductor die, said die pad, said leads, and said wires are encapsulated and said terminal protrudes to the outside, and then separating said lead frame from said molding die; and (f) cutting said lead frame to obtain pieces of said plurality of plastic packages.

BRIEF DESCRIPTION OF THE DRAWINGS

FIG. 11 is a cross-sectional view of the principal part of a lead frame, which illustrates a manufacturing method of a semiconductor device that is an embodiment of the present invention.

DESCRIPTION OF THE PREFERRED EMBODIMENTS

Hereinafter, embodiments of the present invention will be described with reference to the accompanying drawings. Note that components having the same function are denoted by the same reference symbols throughout the drawings for describing the embodiments and the repetitive description thereof will be omitted. Also, in the following embodiments, the descriptions of the same or equivalent components will not be repeated in principle unless required.

Embodiment 1

Figure 1:
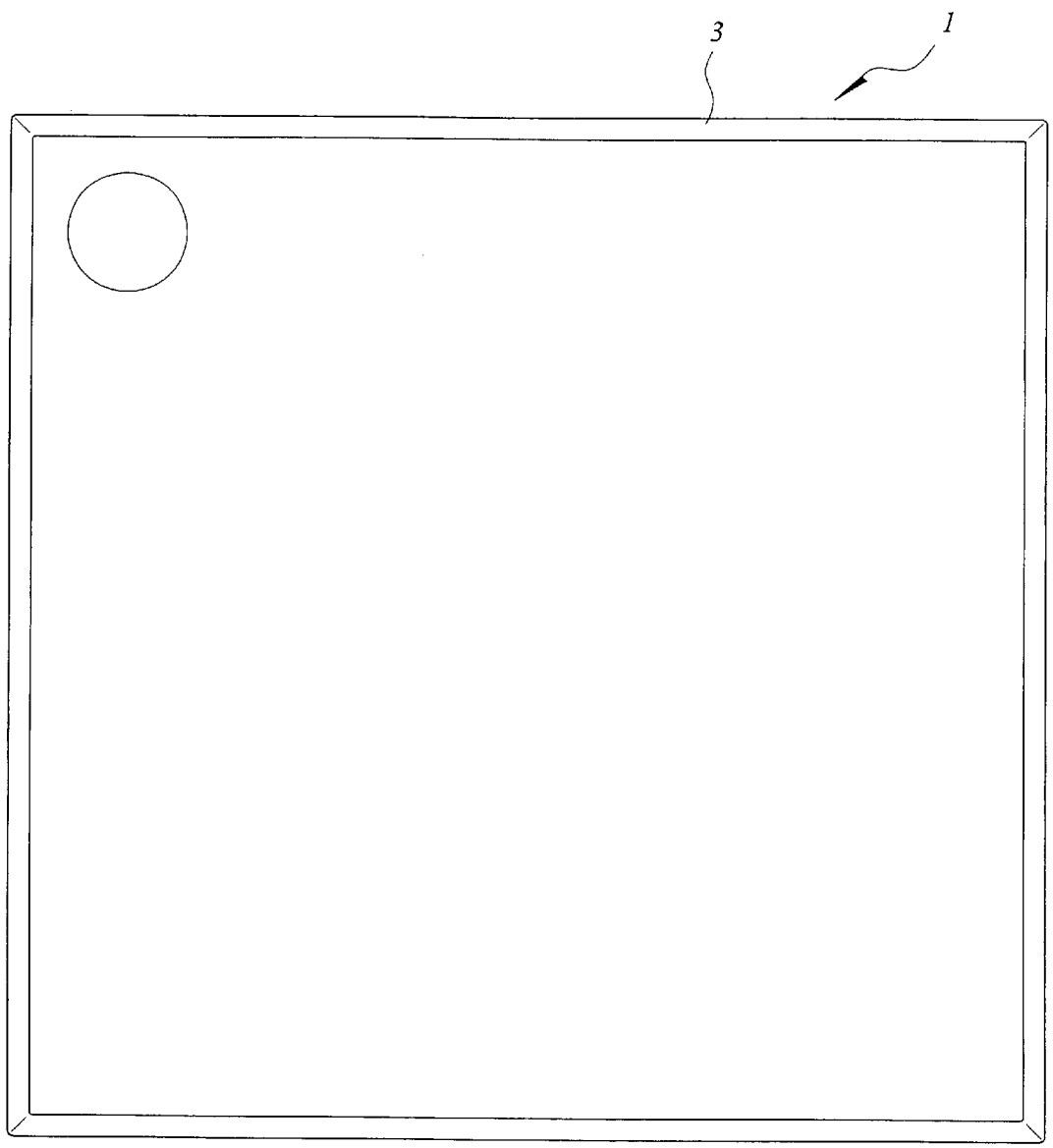
FIG. 1 is a plan view showing an outward appearance (surface side) of a semiconductor device that is an embodiment of the present invention.
Figure 2:
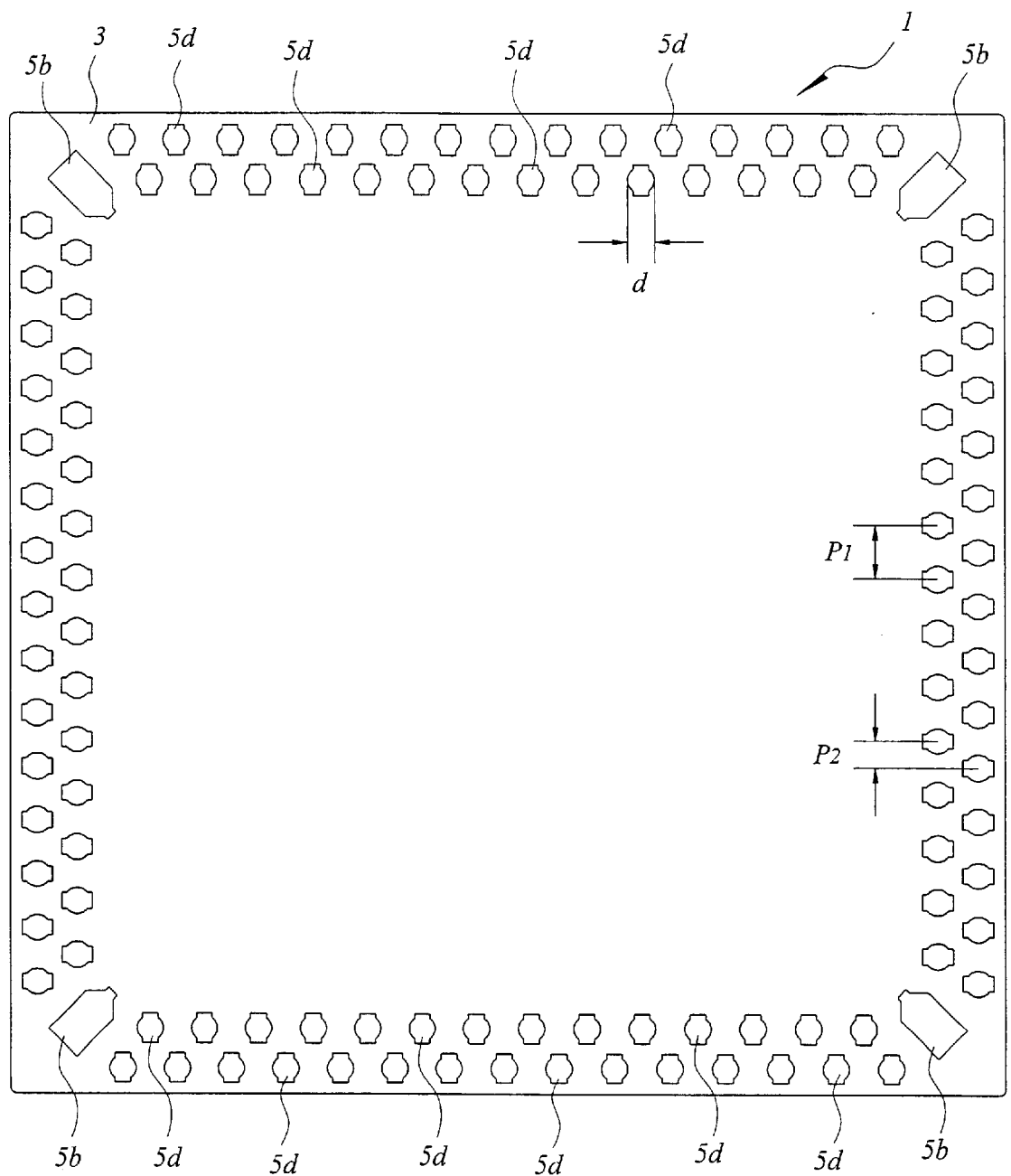
FIG. 2 is a plan view showing an outward appearance (rear surface side) of a semiconductor device that is an embodiment of the present invention.
Figure 3:
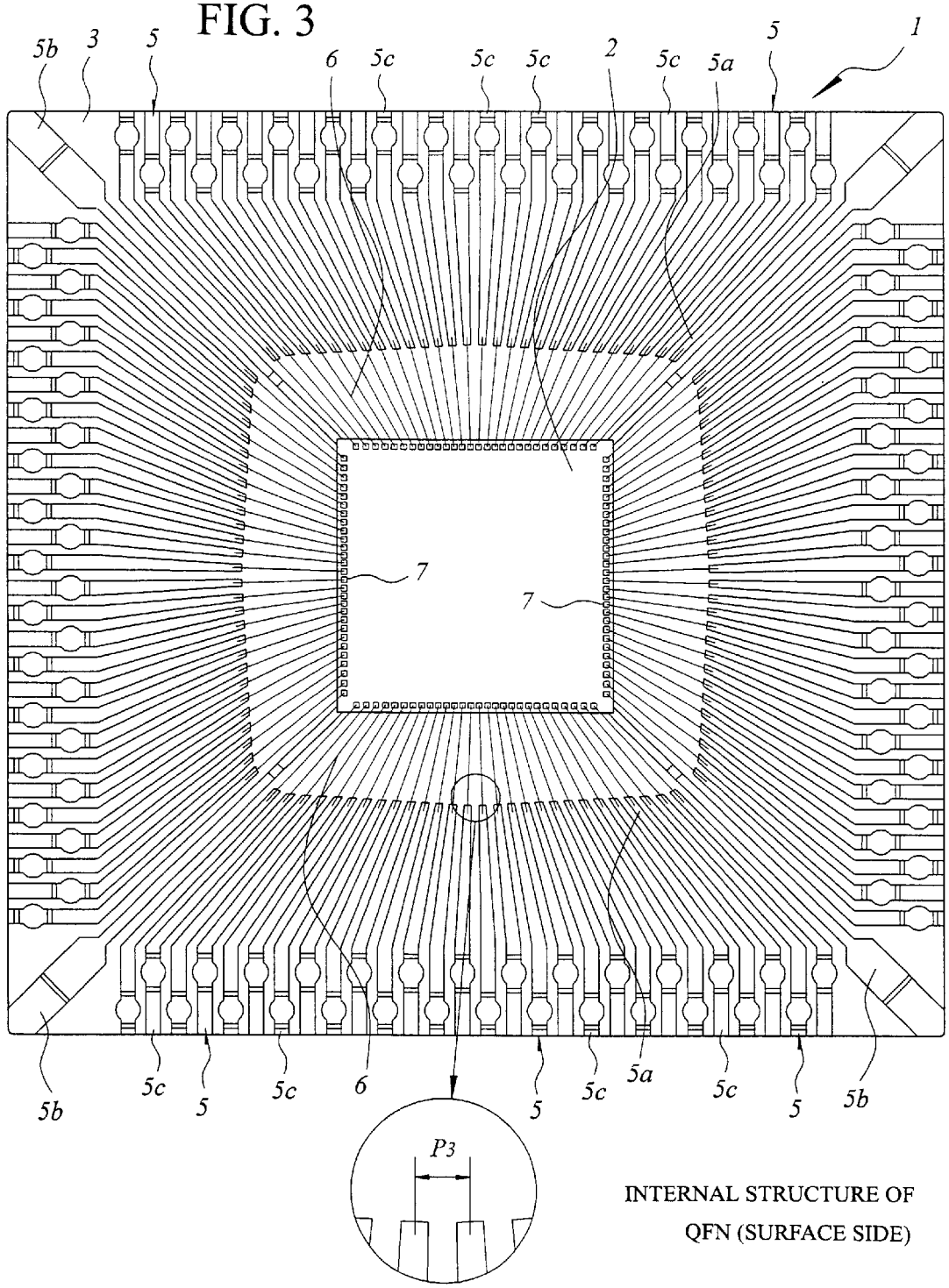
FIG. 3 is a plan view showing an internal structure (surface side) of a semiconductor device that is an embodiment of the present invention.
Figure 4:
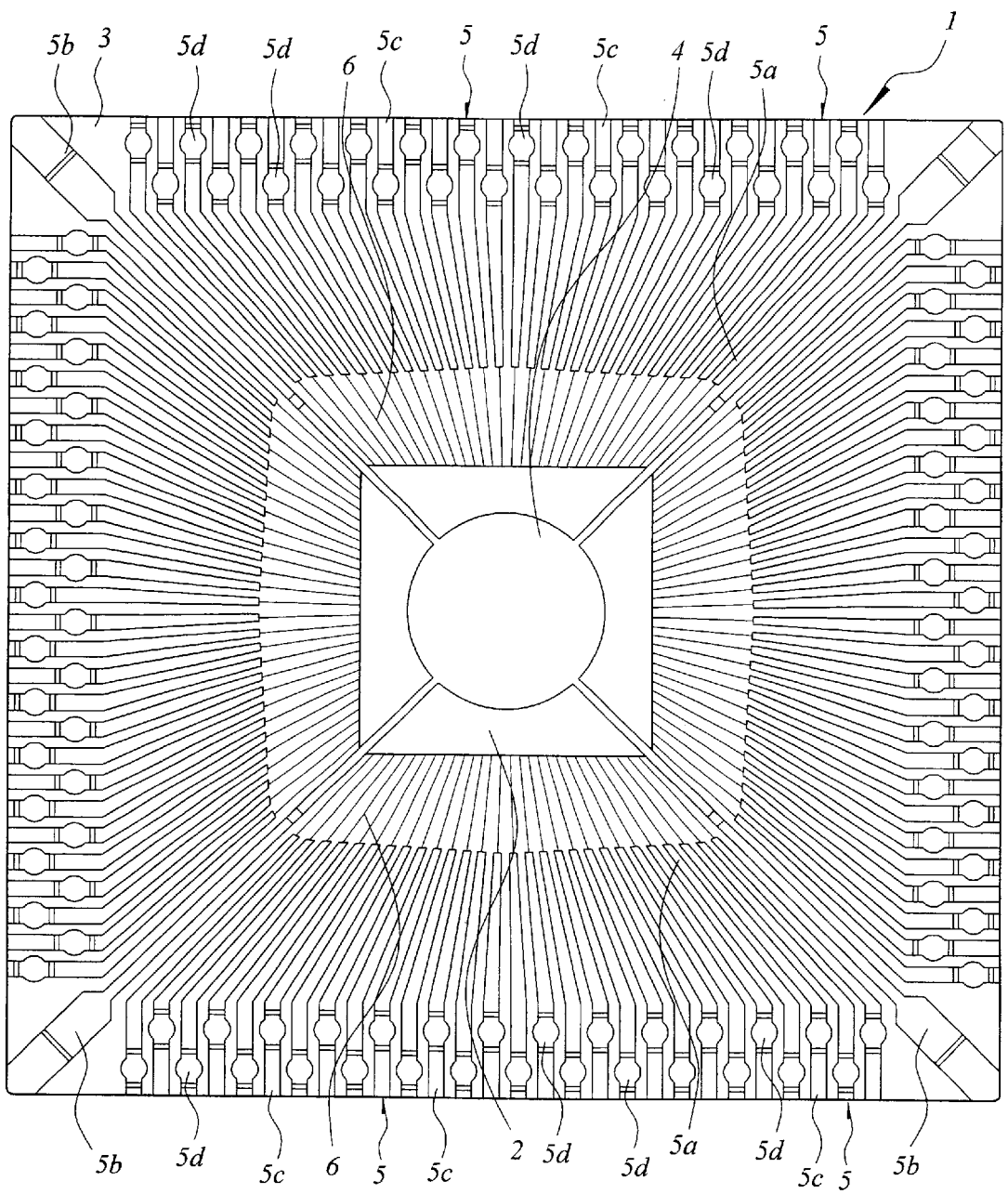
FIG. 4 is a plan view showing an internal structure (rear surface side) of a semiconductor device that is an embodiment of the present invention.
Figure 5:
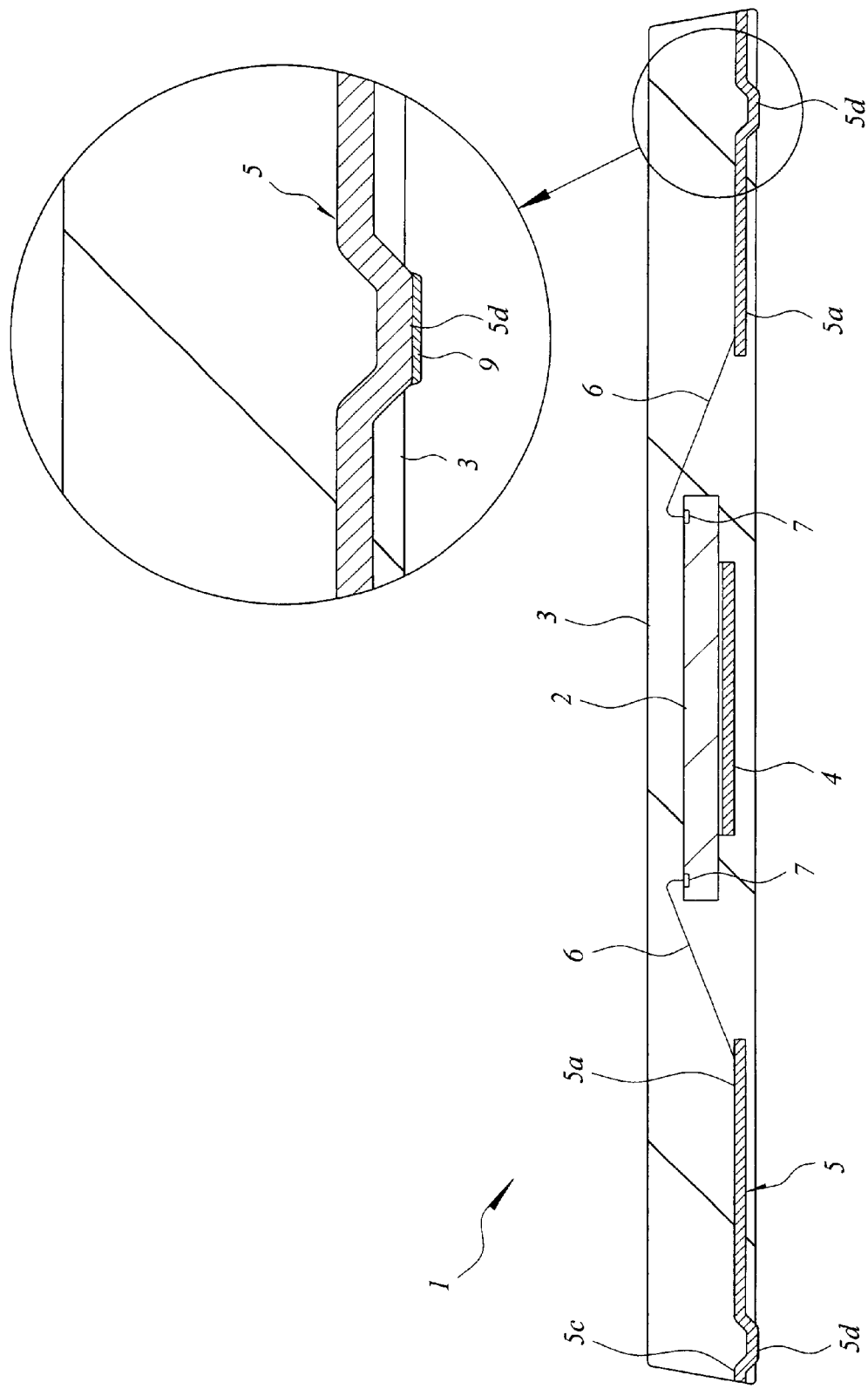
FIG. 5 is a cross-sectional view of a semiconductor device that is an embodiment of the present invention.

FIG. 1 is a plan view showing an outward appearance (surface side) of a QFN according to this embodiment, FIG. 2 is a plan view showing an outward appearance (rear surface side) of the QFN, FIG. 3 is a plan view showing an internal structure (surface side) of the QFN, FIG. 4 is a plan view showing an internal structure (rear surface side) of the QFN, and FIG. 5 is a cross-sectional view of the QFN.

A QFN 1 according to this embodiment has a surface-mounting type package structure in which one semiconductor die 2 is encapsulated in a plastic package 3 made of a resin, and has dimensions of, for example, length×width=12 mm×12 mm and thickness=1.0 mm.

The semiconductor die 2 is arranged at the center of the plastic package 3 while being mounted on a metal die pad 4. A side of the semiconductor die 2 has a size of, for example, 4 mm. The die pad 4 has a so-called small tab structure in which the diameter thereof is smaller than that of the semiconductor die 2, in order to allow various types of semiconductor dies 2 each having a side within, for example, a range from 4 to 7 mm to be mounted. In this embodiment, the diameter of the die pad 4 is 3 mm. The die pad 4 and the semiconductor die 2 are supported by four die pad supports 5b, each having one tip portion connected to the die pad 4 and the other tip portion extending to one of the four corners of the plastic package 3.

A plurality (for example, 116) of leads 5 are arranged around the die pad 4 so as to surround the die pad 4. A lead tip 5a of each lead 5 (on one side near the semiconductor die 2) is electrically connected to a bonding pad 7 on the main surface of the semiconductor die 2 via a gold wire 6. Also, a lead tip 5c on the other side opposite to the lead tip 5a on one side terminates at a side surface of the plastic package 3.

Each of the above-mentioned leads 5 is such that the lead tip 5a on one side is extended to a position close to the die pad 4 in order to reduce the length between the semiconductor die 2 and it, and the interval ($P_3$) between the lead tips 5a on one side is narrower (for example, 0.18 mm to 0.2 mm) than that between the lead tips 5c on the other side. Thus, since the lead tips 5a on one side of the leads 5 are extended to the positions close to the die pad 4, it is possible to reduce each length of gold wires 6 that connect the lead tips 5a on one side and the bonding pads 7 (for example, 3 mm or shorter), respectively. Therefore, even if the number of pins used in the QFN 1 is increased and even if the interval between the leads 5, that is, the interval between the gold wires 6 becomes narrowed depending on an increase in the number of pins used in the QFN 1, then it is possible to reduce the occurrence of defects such as short-circuits between the gold wires 6 in the manufacturing process of the QFN 1 (for example, wire bonding process and resin molding process).

As shown in FIG. 2, a plurality (for example, 116) of external connection terminals 5d formed by bending each part of the plurality of leads 5 are arranged two lines in a zigzag pattern along each side of the plastic package 3, on a rear surface (substrate mounting surface) of the plastic package 3 constituting the package of the QFN 1. These terminals 5d protrudes from the rear surface of the plastic package 3 to the outside, and have solder layers 9 formed on the surfaces thereof by a printing method or a plating method (FIG. 5).

Each of the above-mentioned terminals 5d has a width larger than the width of each lead 5 in order to ensure a mounting area. The width (d) of each terminal 5d is, for example, 0.3 mm, and the interval ($P_1$) between the adjoining terminals 5d in the same line is 0.65 mm, and the interval ($P_2$) between the interstitial terminals in different line is 0.325 mm. In addition, the bending amount of each lead 5 and the thickness of each solder layer 9 are determined so that the height of the terminal 5d having the solder layer 9 on its surface (height including that of the solder layer 9), that is, the protrusive amount (standoff amount) from the rear surface of the plastic package 3 becomes at least 50 µm or larger.

The other tip portions of the above-mentioned four die pad supports 5b are respectively exposed at four corners on the rear surface of the plastic package 3. Each width of the die pad supports 5b exposed on the rear surface of the plastic package 3 is larger than that of the die pad supports 5b inside the plastic package 3. Although not shown in the drawings, the solder layers 9 are formed also on the surfaces of the die pad supports 5b exposed on the rear surface of the plastic package 3 by the printing method or the plating method. Also, the height of each die pad support 5b (height including that of each solder layer 9) exposed from the rear surface of the plastic package 3, that is, the protrusive amount (standoff amount) from the rear surface of the plastic package 3 is the same as the protrusive amount of each terminal 5d.

Figure 6:
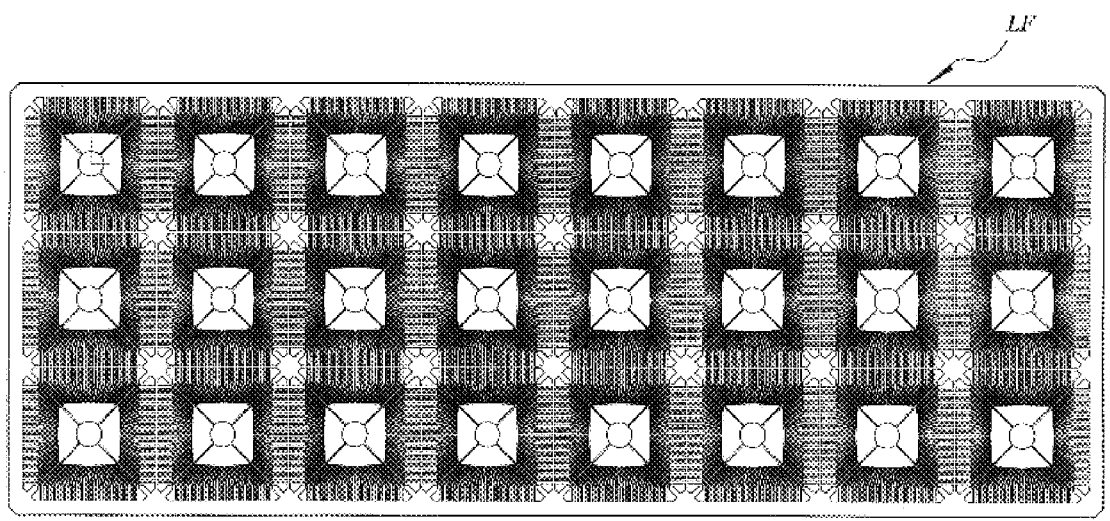
FIG. 6 is a plan view showing the entire lead frame used in the manufacture of a semiconductor device that is an embodiment of the present invention.

To manufacture the QFN 1 of this embodiment, which is constituted as described above, a lead frame LF as shown in FIG. 6 is prepared at first. The lead frame LF is formed of a metal sheet made of Cu, Cu alloy, or Fe—Ni alloy with a thickness of about 100 to 150 µm, in which the above-described patterns such as die pads 4, leads 5, die pad supports 5b, and the like are repeatedly formed laterally and longitudinally. More specifically, this lead frame LF has a multiple string structure capable of mounting a plurality of (for example, 24) semiconductor dies 2.

Figure 7:
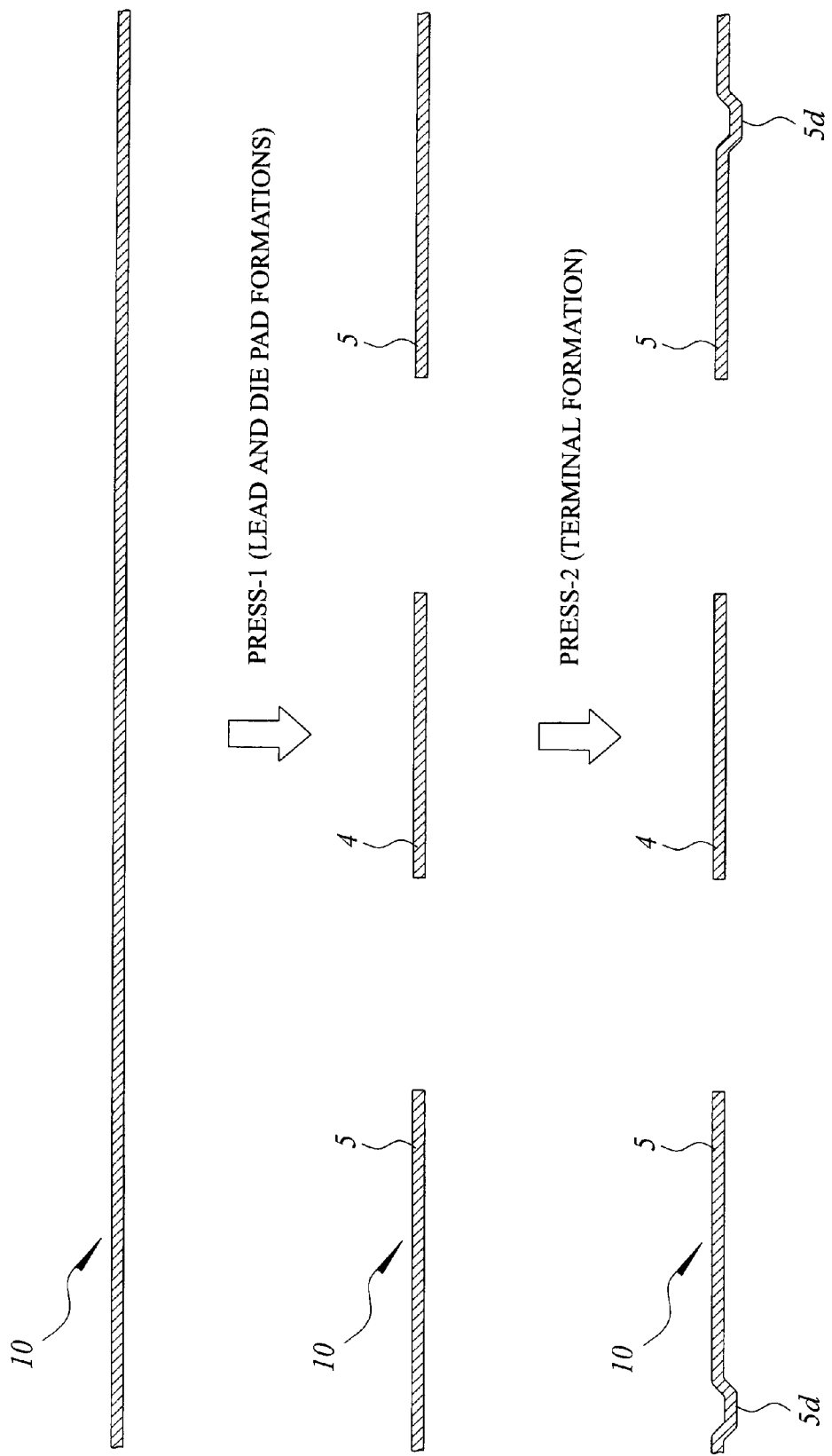
FIG. 7 is a cross-sectional view showing the principal part of a manufacturing method of the lead frame shown in FIG. 6.

To manufacture the above-mentioned lead frame LF, as shown in FIG. 7, a metal sheet 10 is first pressed to punch out patterns such as leads 5, die pad supports 5b, die pads 4 and the like, and subsequently the middle portion of each lead 5 is pressed and bent, whereby the terminal 5d is formed.

Figure 8:
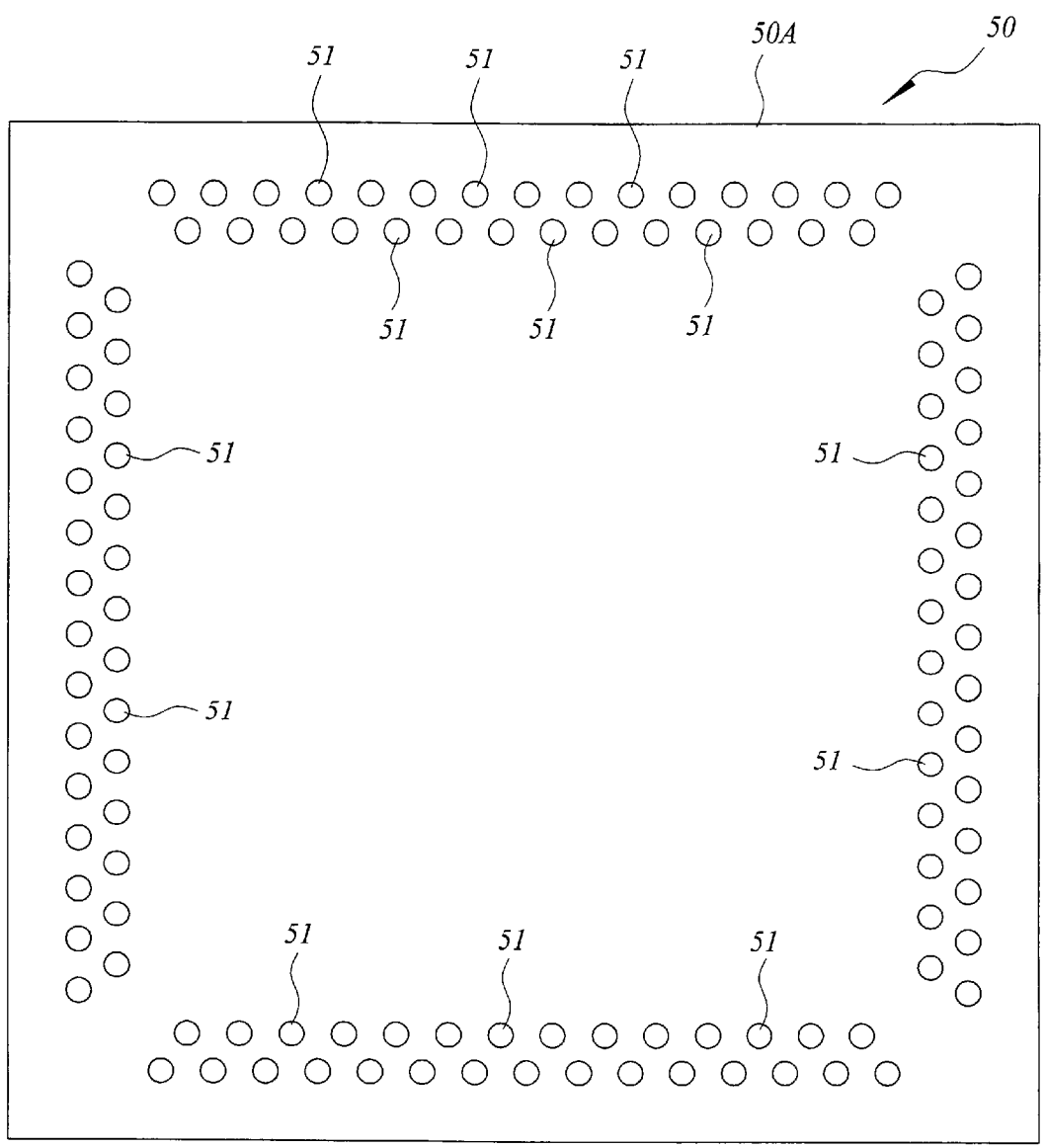
FIG. 8 is a plan view showing the principal part of an upper die of a press die used in the manufacture of the lead frame shown in FIG. 6.
Figure 9:
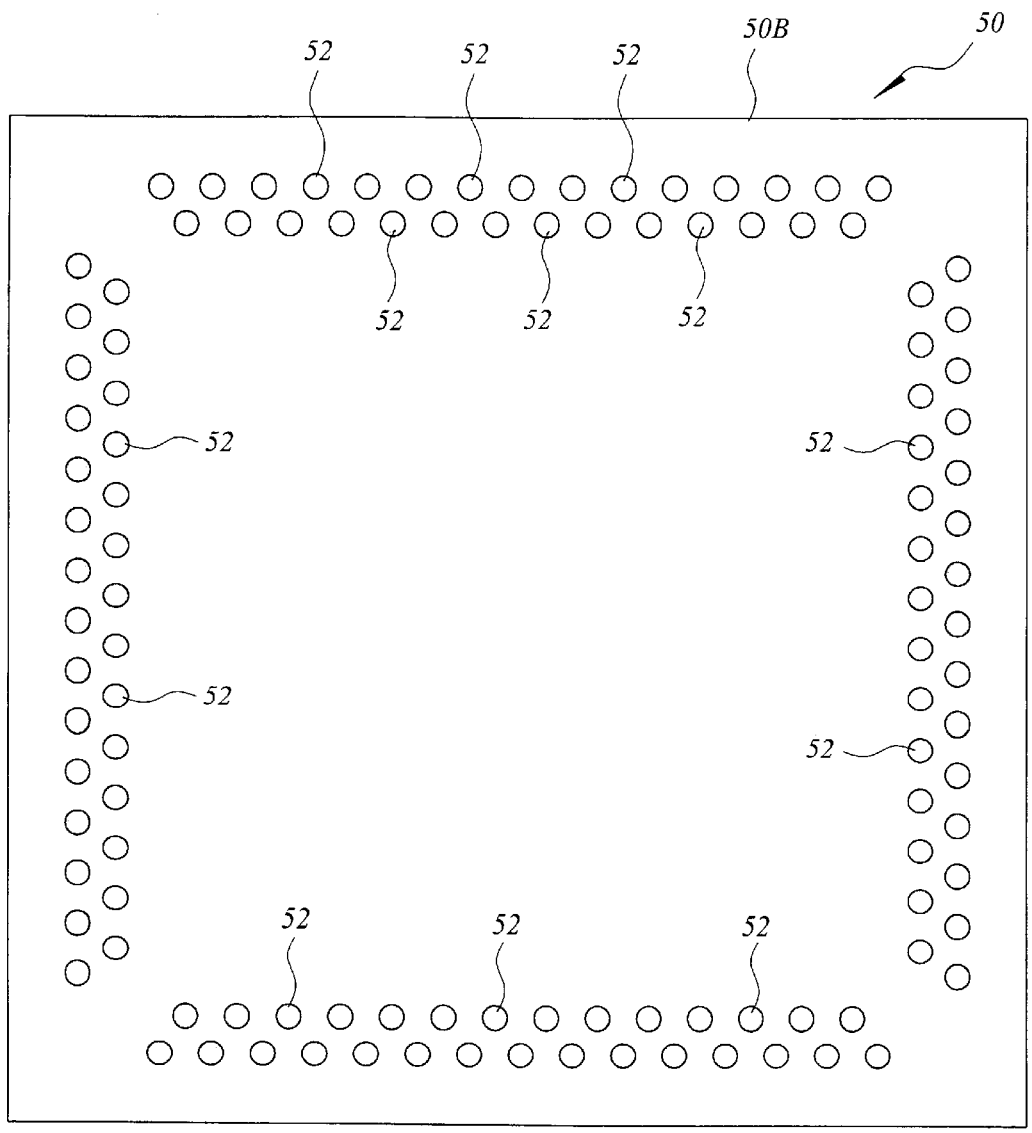
FIG. 9 is a plan view of the principal part of a lower die of a press die used in the manufacture of the lead frame shown in FIG. 6.

As shown in FIGS. 8 and 9, a press die 50 used for bending the leads 5 is composed of an upper die 50A (FIG. 8) having the same number of punches 51 as that of the leads 5 (for example, 116) and a lower die 50B (FIG. 9) having a plurality of dies 52 for receiving the above-mentioned punches 51.

Figure 10:
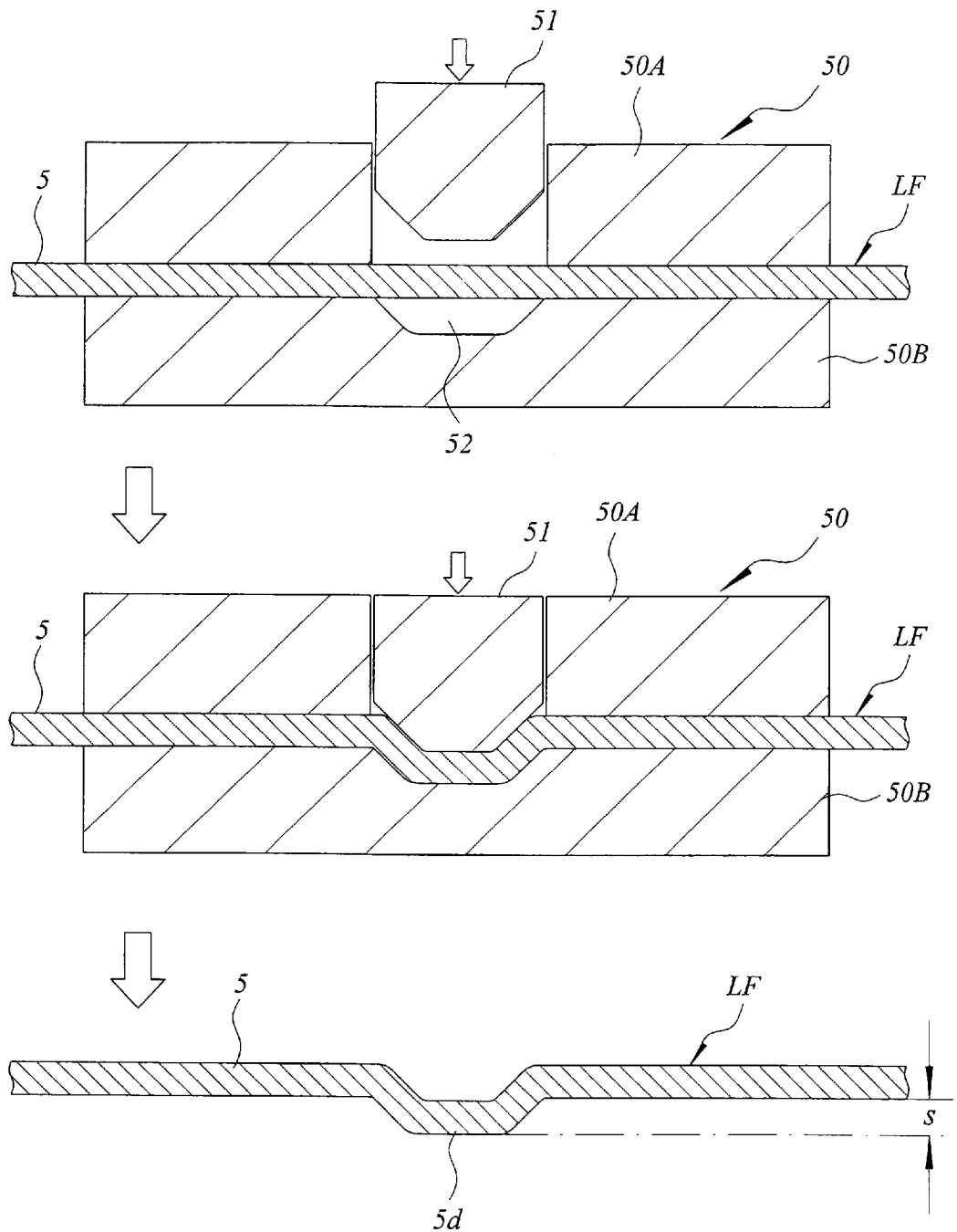
FIG. 10 is a cross-sectional view of the principal part showing a manufacturing method of a terminal by the use of the press die shown in FIGS. 8 and 9.

To form the terminals 5d by the use of the press die 50, as shown in FIG. 10, the metal sheet 10 is sandwiched between the upper die 50A and the lower die 50B. In this state, when the punches 51 of the upper die 50A are respectively pressed into the dies 52 of the lower die 50B, the middle portion of each lead 5 is plastic-deformed to bend downward, whereby the terminals 5d are formed. At this time, the bending amount (s) of each lead 5 is almost equivalent to the thickness of the metal sheet 10 (100 to 150 µm).

Although not shown in the drawings, by pressing and bending the middle portion of each die pad support 5b, the height of the die pad 4 is adjusted at almost the same time of the formation of the terminals 5d. In addition, the die pad supports 5b are pressed and bent so that each tip portion thereof can be exposed from the plastic package 3. At this time, the bending amount of each die pad support 5b is set to the same as the above-described bending amount (s) of each lead 5. Thereafter, as shown in FIG. 11, by forming an Ag plating layer 11 on a surface of each lead tip 5a on one side of the leads 5 (a region to which each gold wire 6 is bonded) by an electroplating method, the lead frame LF is completed.

Thus, the metal sheet 10 is sheared and processed to form the patterns such as the leads 5, die pad supports 5b, die pads 4, terminals 5d and the like in this embodiment. Therefore, the manufacturing process of the lead frame LF can be simplified in comparison to the case of forming these patterns by etching, whereby the manufacturing cost thereof can be reduced.

Figure 12:
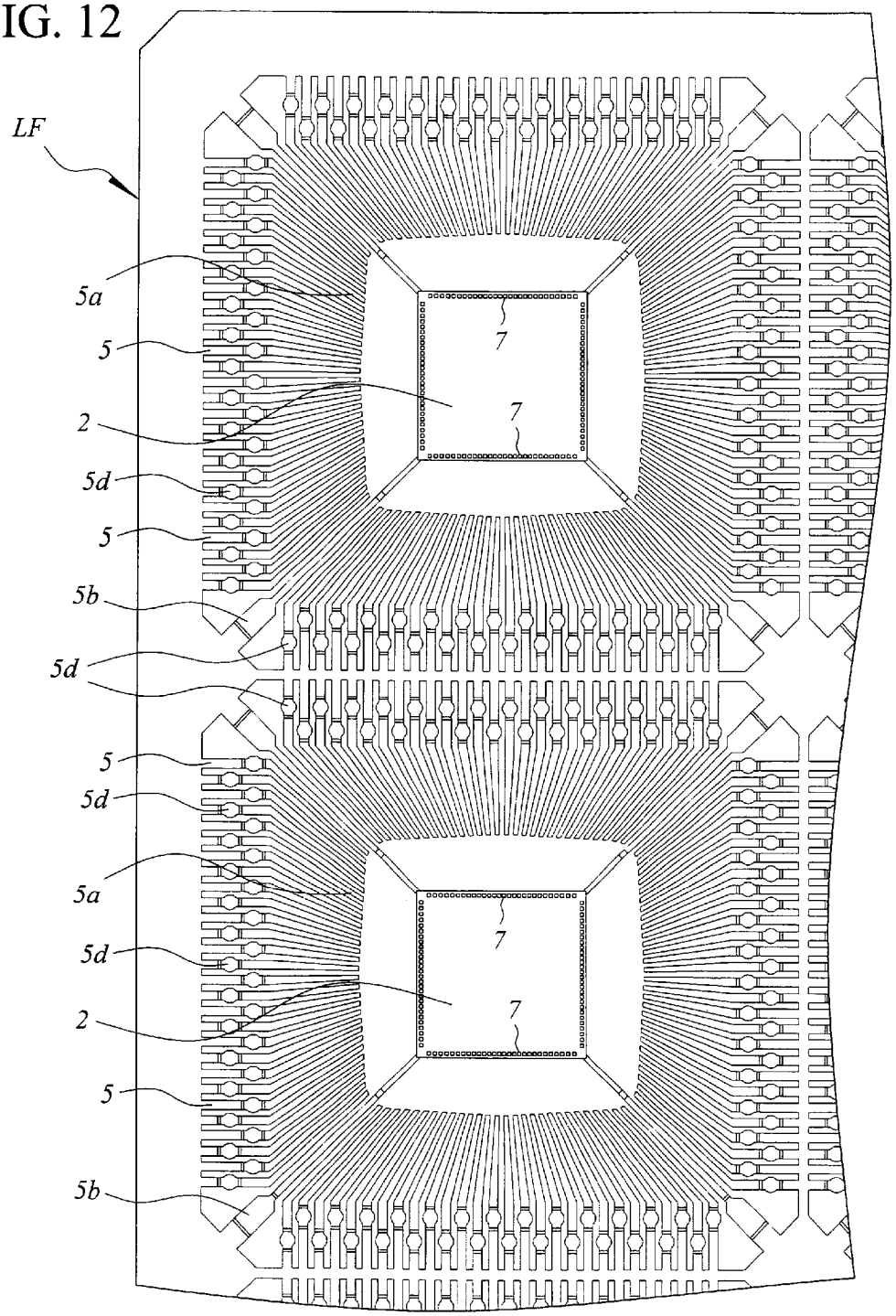
FIG. 12 is a plan view of the principal part of a lead frame after adhering semiconductor dies thereto, which illustrates a manufacturing method of a semiconductor device that is an embodiment of the present invention.

Next, as shown in FIG. 12, the semiconductor die 2 is adhered to each surface of the plurality of die pads 4 formed on the lead frame LF by the use of Au paste, epoxy adhesive, or the like. Thereafter, as shown in FIGS. 13 and 14, the bonding pads 7 of the semiconductor die 2 and the lead tips 5a on one side of the leads 5 are respectively connected via the gold wires 6 by the use of the well-known wire bonding apparatus.

Figure 13:
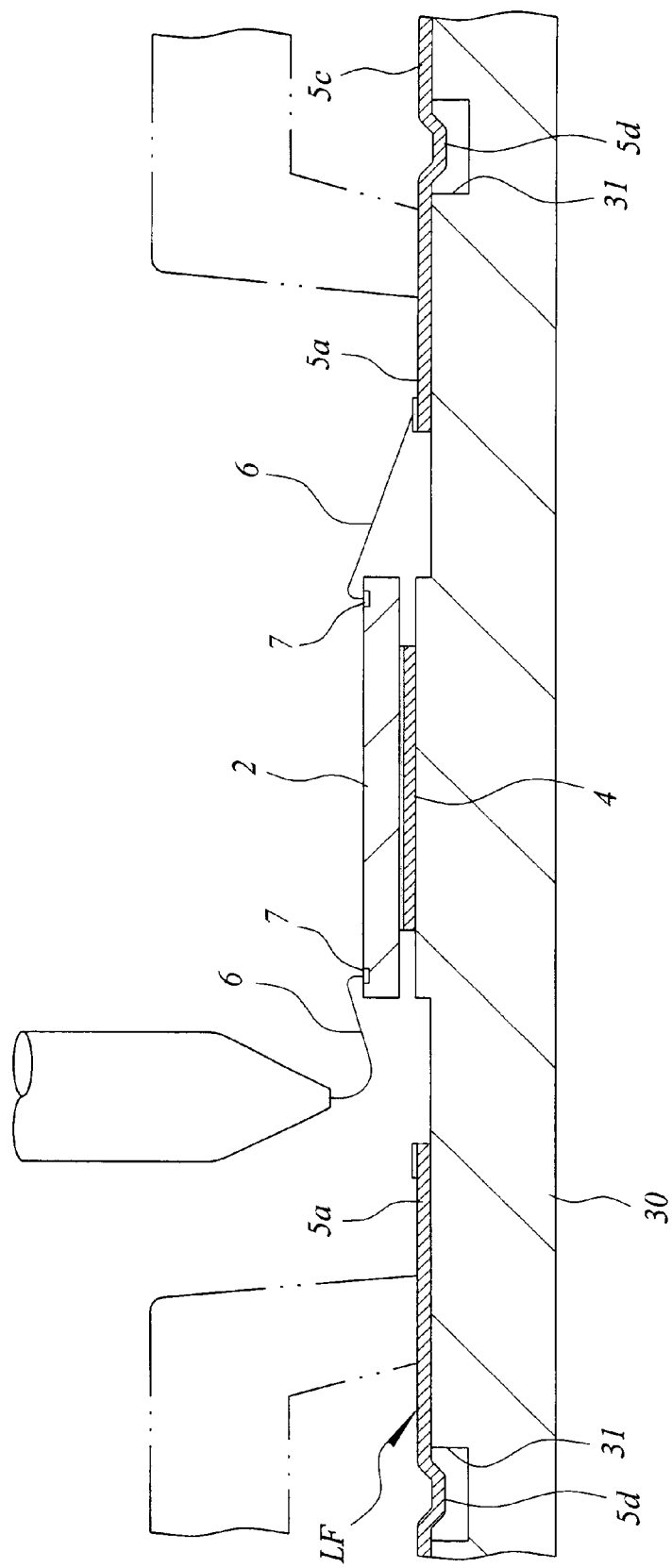
FIG. 13 is a schematic diagram illustrating a manufacturing method of a semiconductor device that is an embodiment of the present invention.
Figure 14:
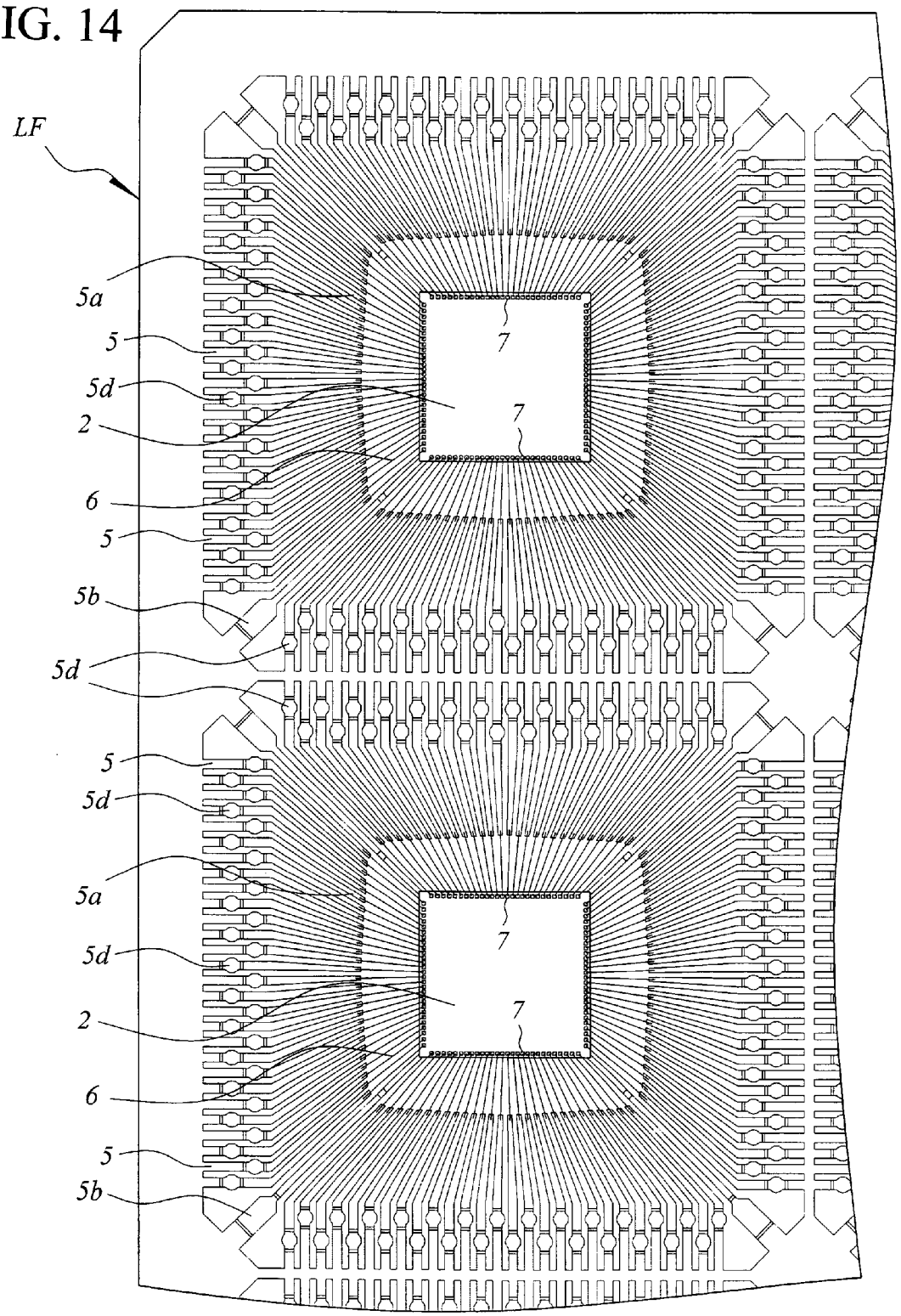
FIG. 14 is a plan view of the principal part of a lead frame after bonding wires, which illustrates a manufacturing method of a semiconductor device that is an embodiment of the present invention.

As shown in FIG. 13, since the protrusion-shaped terminals 5d are located on the rear surface of the lead frame LF, it is preferable in the above-mentioned wire bonding process to form grooves 31 in a jig 30 that supports the lead frame LF at positions corresponding to the protrusions of the terminals 5d. By so doing, it is possible to stably hold the lead frame LF on the jig 30. Therefore, it is possible to prevent the occurrence of positional deviations of the gold wires 6 from the leads 5 and those of the gold wires 6 from the bonding pads 7. Also, if the jig provided with the grooves 31 is used in adhering the semiconductor die 2 the surface of the die pad 4, a positional deviation of the semiconductor die 2 from the die pad 4 can be prevented.

Figure 15:
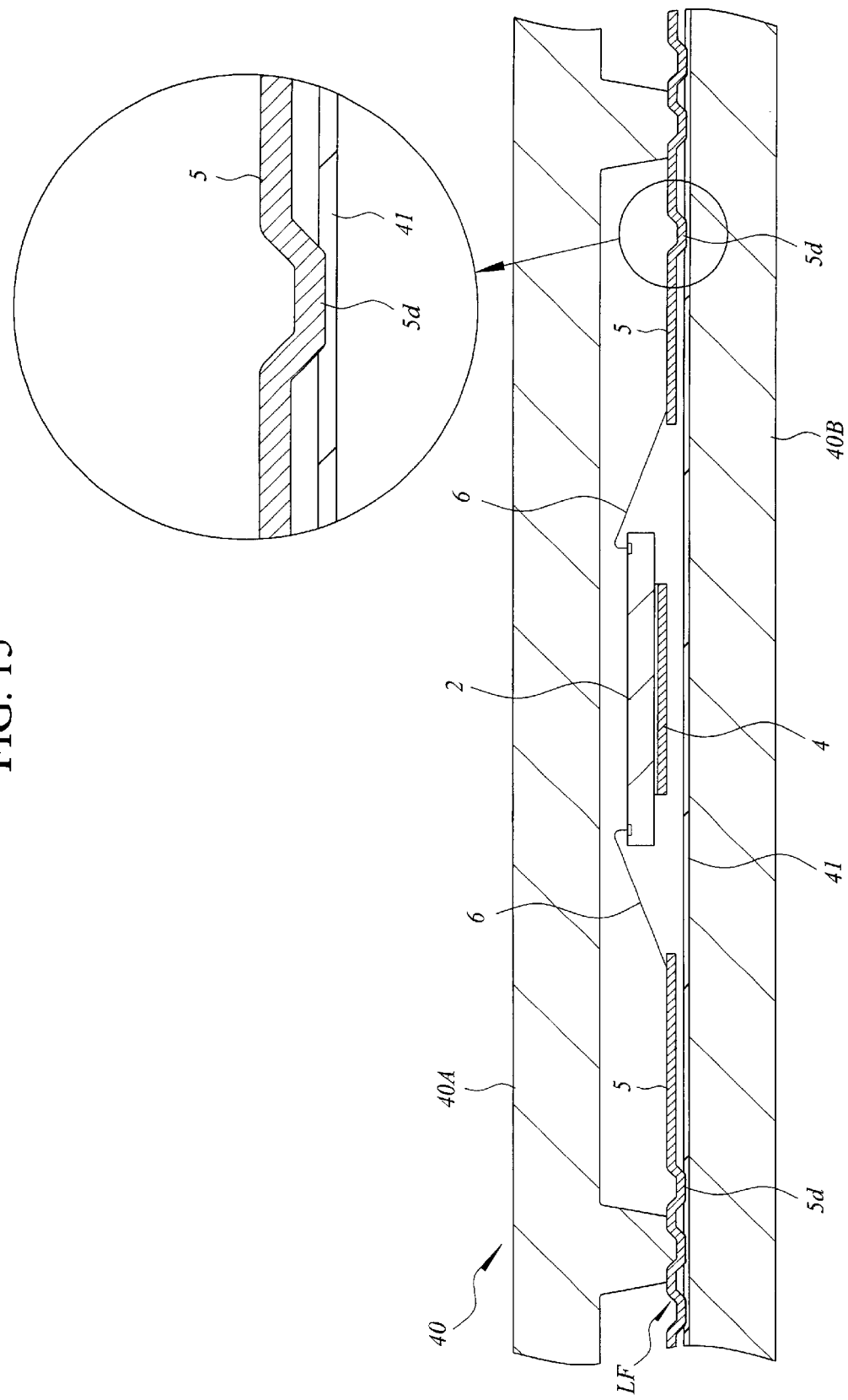
FIG. 15 is a cross-sectional view of the principal parts of a molding die and a lead frame, which illustrates a manufacturing method of a semiconductor device that is an embodiment of the present invention.

Next, as shown in FIG. 15, the above-mentioned lead frame LF is mounted on a molding die 40. FIG. 15 is a cross-sectional view showing a part of the molding die 40 (an area corresponding to about one QFN).

To perform the resin encapsulation of the semiconductor die 2 using the molding die 40, a thin resin film 41 with a thickness of about 25 to 100 μm is firs laid on a surface of a lower die 40B, and the lead frame LF is positioned on the resin film 41. The lead frame LF is such that the surfaces, on which the protrusion-shaped terminals 5 are formed, are placed downward and that the lower surfaces of the terminals 5d are contacted with the resin film 41. In this state, when the upper surface of the lead frame LF is pressed with an upper die 40A, the lower surfaces of the terminals 5d are pressed about 10 to 30 μm into the resin film 41 by the pressing force. Further, although not shown in the drawings, the lower surfaces of the other tip portions of the die pad supports 5b are also pressed into the resin film 41.

Figure 16:
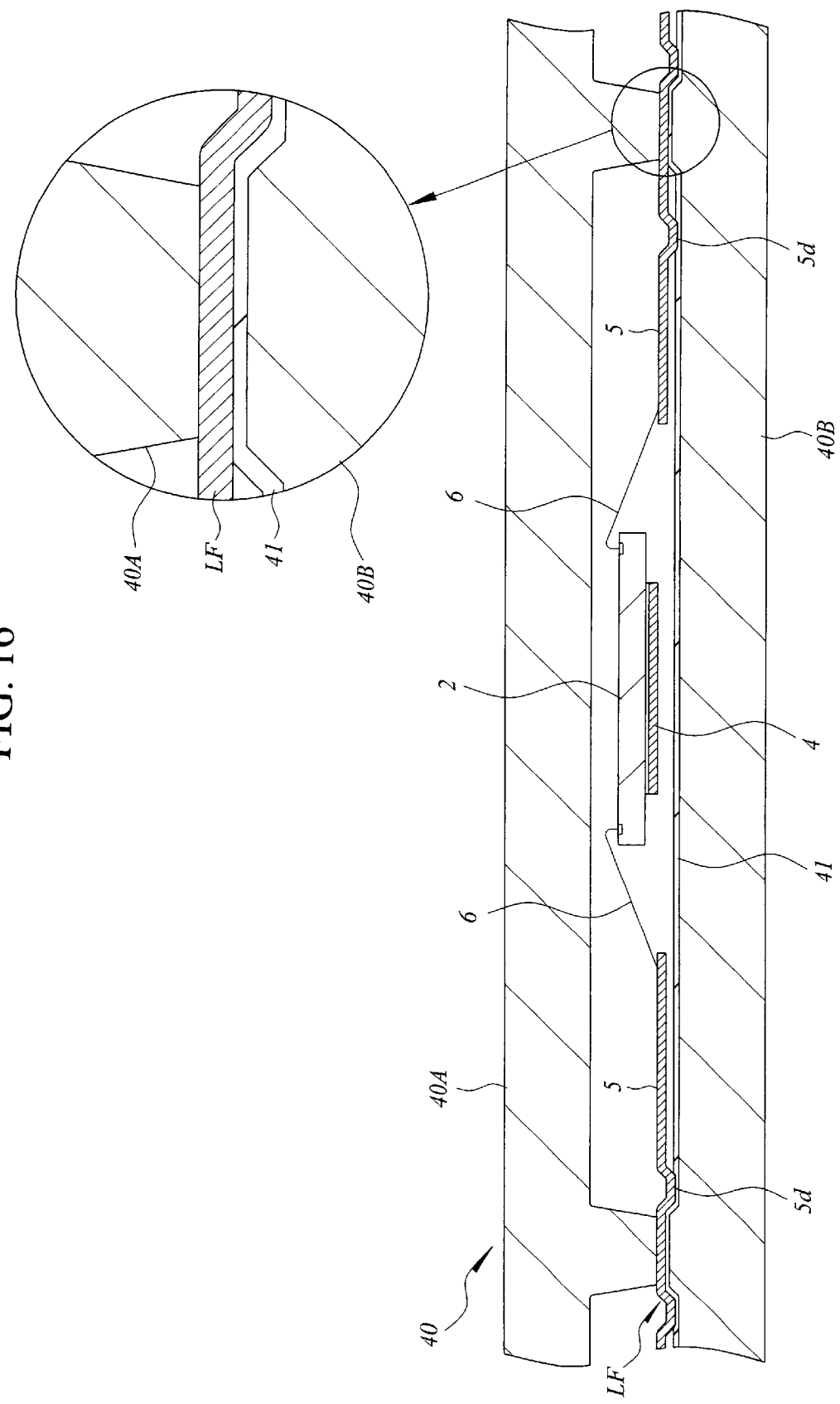
FIG. 16 is a cross-sectional view of the principal parts of a molding die and a lead frame, which illustrates a manufacturing method of a semiconductor device that is an embodiment of the present invention.

Note that the molding die 40 has a structure of pressing the upper surface of the lead frame LF with the upper die 40A, but, for example, as shown in FIG. 16, may also have a structure of pushing the resin film 41 and the lead frame LF from both sides with the upper and lower dies 40A and 40B. In the case of using the molding die shown in FIG. 15, the parts of the lead frame LF to be contacted to the upper die 40A are bent downward in advance. However, in the case of using the molding die shown in FIG. 16, it is unnecessary to bend it.

In addition, when the upper surface of the lead frame LF is pressed with the upper die 40A, an upward force works on the lead tips 5a on one side of the leads 5 due to the spring force of the metal sheet constituting the lead frame LF. Therefore, in the case where the terminals 5d are arranged in two lines like those on the lead frame LF in this embodiment, the forces necessary for pressing the resin film 41 with the terminals 5d are different between a lead 5 having the terminal 5d near the lead tip 5a on one side of the lead 5 and a lead 5 having the terminal 5d apart from the lead tip 5a on one side in comparison with the above-mentioned terminal 5d. More specifically, the force to press the resin film 41 by the terminal 5d formed near the lead tip 5a on one side is weaker than that by the terminal 5d formed apart from the lead tip 5a on one side (=near the contact portion between the upper die 40A and the lead 5). As a result, a protrusive amount (standoff amount) from the rear surface of the plastic package 3 is different between the terminal 5d formed near the lead tip 5a on one side and the terminal 5d formed apart from the lead tip 5a on one side. When these terminals 5d are soldered to the electrodes (footprint) on the wiring board, there is a possibility that an open defect, namely, the fact that some terminals 5d and the electrodes are not contacted therebetween, will occur.

Figure 17:
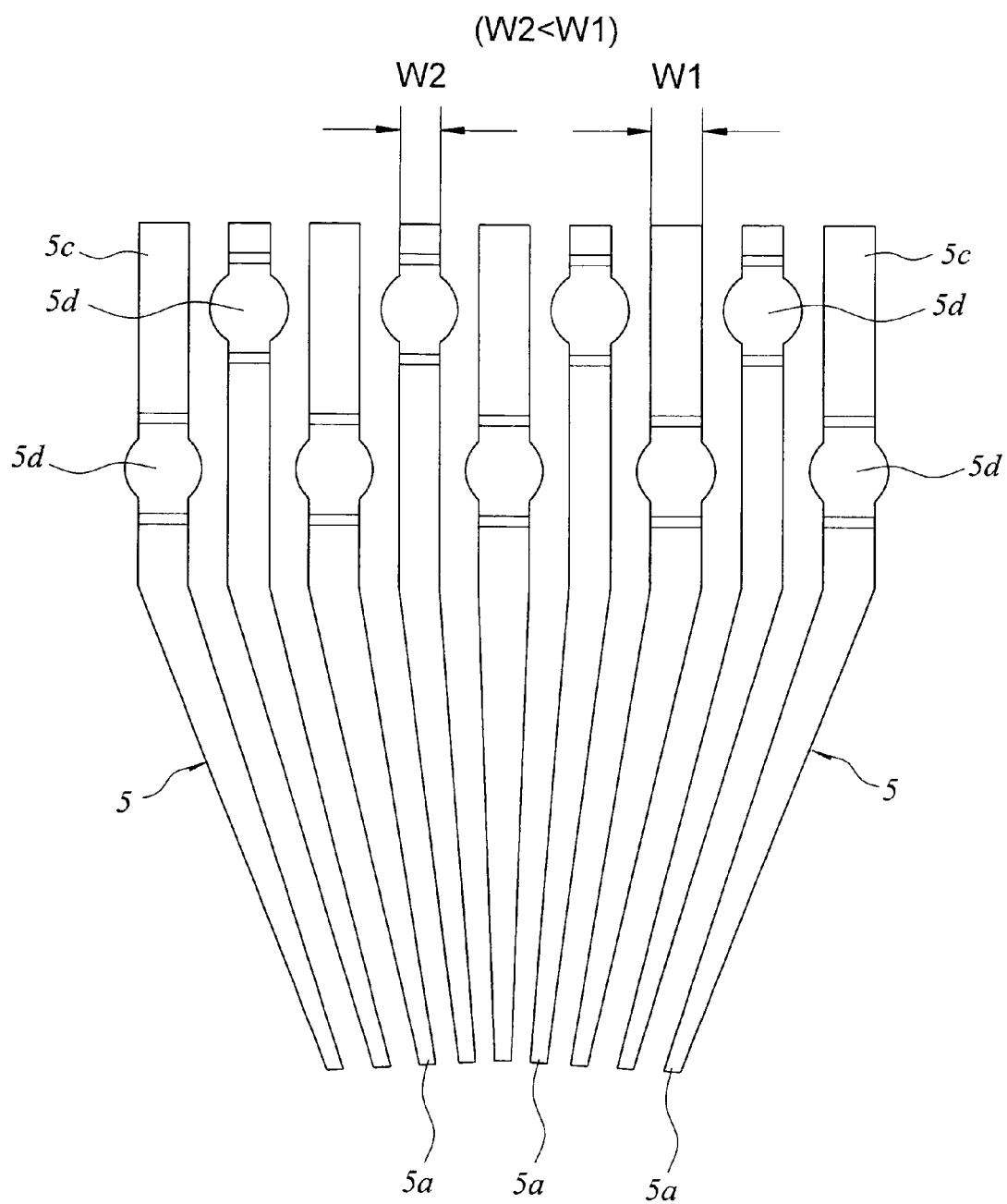
FIG. 17 is a plan view of the principal part of a lead frame, which illustrates a manufacturing method of a semiconductor device that is an embodiment of the present invention.

In the case where there is such possibility, as shown in FIG. 17, it is preferable that the width ($W_1$) of the lead 5 on which the terminal 5d is formed near the lead tip 5a on one side is made larger than the width ($W_2$) of the lead 5 on which the terminal 5d is formed apart from the lead tip 5a on one side ($W_2<W_1$). By so doing, the forces necessary for pressing the resin film 41 with the terminals 5d become almost uniform in all of the leads 5. Therefore, the amounts of the terminals 5d pushed into the resin film 41, namely, the standoff amounts of the terminals 5d protruded from the rear surface of the plastic package 3 to the outside become almost equal to each other in all of the leads 5.

Figure 18:
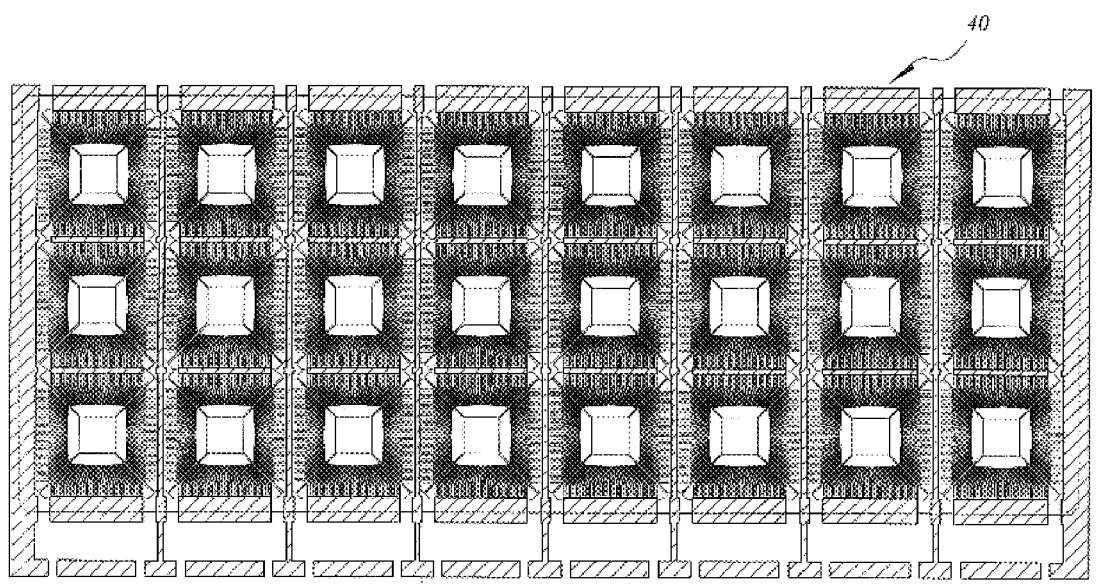
FIG. 18 is a plan view showing the contact portion between a molding die (upper die) and a lead frame, which illustrates a manufacturing method of a semiconductor device that is an embodiment of the present invention.

FIG. 18 is a plan view in which the positions where the upper die 40A of the above-mentioned molding die 40 and the lead frame LF are contacted are marked with diagonal lines. Also, FIG. 19 is a plan view schematically showing the positions of gates of the molding die 40 and the flowing directions of the resin injected into cavities.

As shown in FIG. 18, the above-mentioned molding die 40 is constituted so that the upper die 40A contacts only with the outer frame portion of the lead frame LF and the linking portions between the leads 5 and that all areas other than the contacting areas are effectively used as cavities in which the resin is injected.

Figure 19:
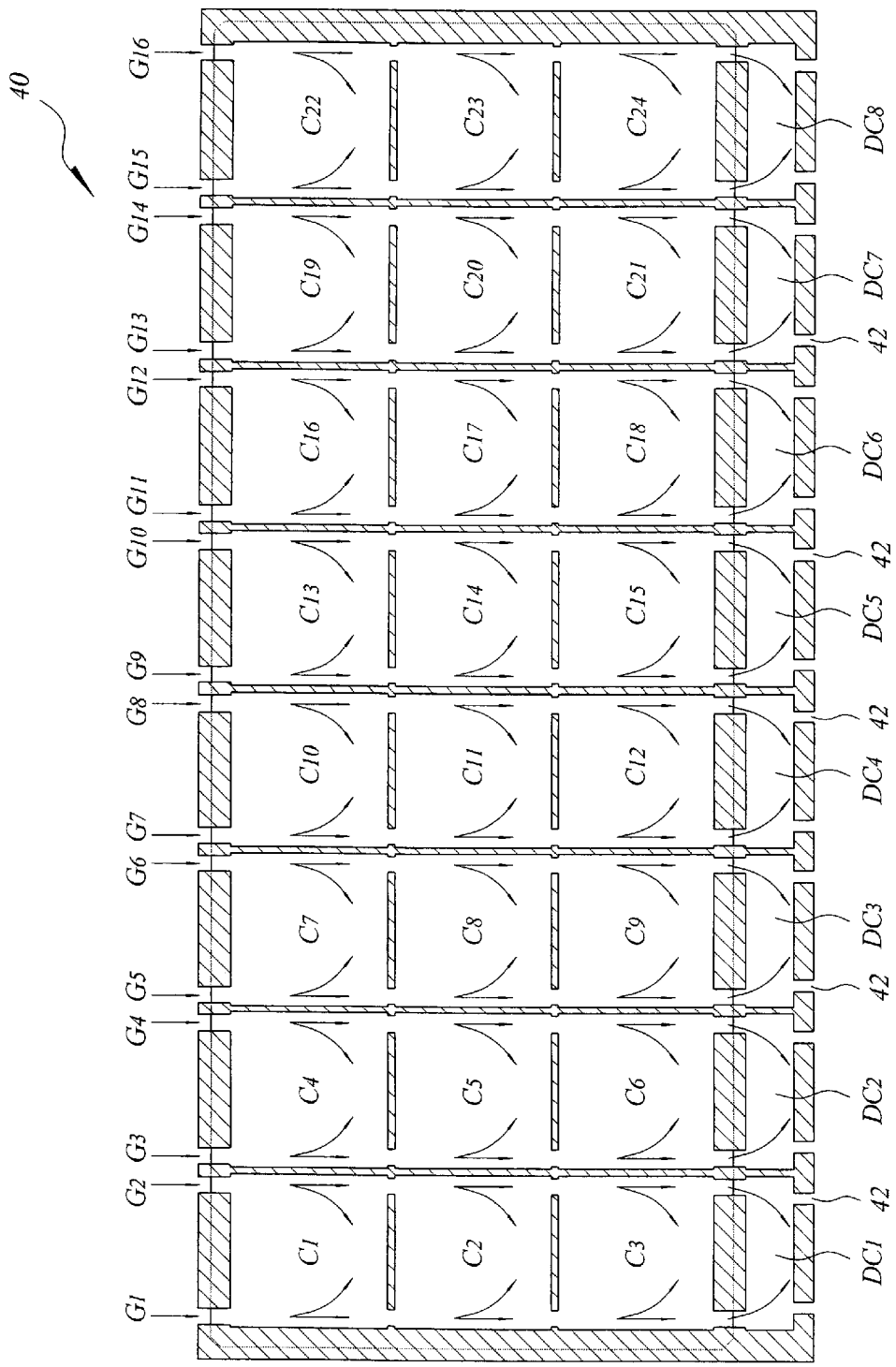
FIG. 19 is a plan view schematically showing the positions of gates of a molding die and the flowing directions of resins injected into cavities, which illustrates a manufacturing method of a semiconductor device that is an embodiment of the present invention.

In addition, as shown in FIG. 19, a plurality of gates $G_1$ to $G_{16}$ are provided on one side of the above-mentioned molding die 40. For example, the resin is injected through the gates $G_1$ and $G_2$ into the longitudinally arranged three cavities $C_1$ to $C_3$ on the left side of FIG. 19 and is injected through the gates $G_3$ and $G_4$ into the three cavities $C_4$ to $C_6$ adjoining the cavities $C_1$ to $C_3$. Meanwhile, on the other side opposite to the gates $G_1$ to $G_{16}$, dummy cavities $DC_1$ to $DC_8$ and air vents 42 are provided. For example, when the resin is injected through the gates $G_1$ and $G_2$ into the cavities $C_1$ to $C_3$, the air in the cavities $C_1$ to $C_3$ flows into the dummy cavity $DC_1$, which makes it possible to prevent a void from being created in the resin in the cavity $C_3$.

Figure 20:
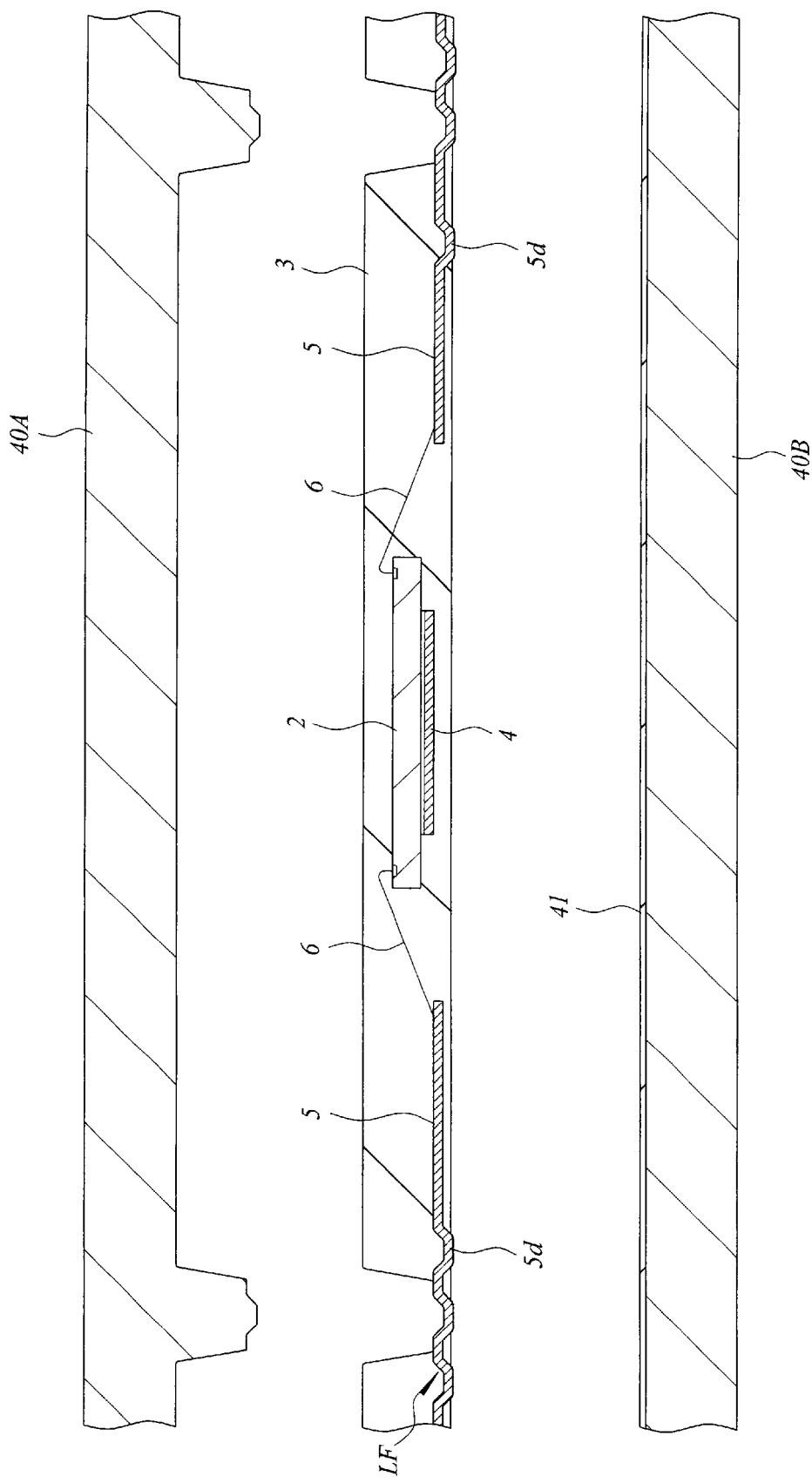
FIG. 20 is a cross-sectional view of the principal parts of a molding die and a lead frame, which illustrates a manufacturing method of a semiconductor device that is an embodiment of the present invention.

Subsequently, resin is injected into a gap (cavity) between the upper die 40A and the lower die 40B of the molding die 40 shown in FIGS. 15 and 16. Thereafter, the upper die 40A and the lower die 40B are separated from each other as shown in FIG. 20, whereby the plastic package 3 is formed.

Figure 21:
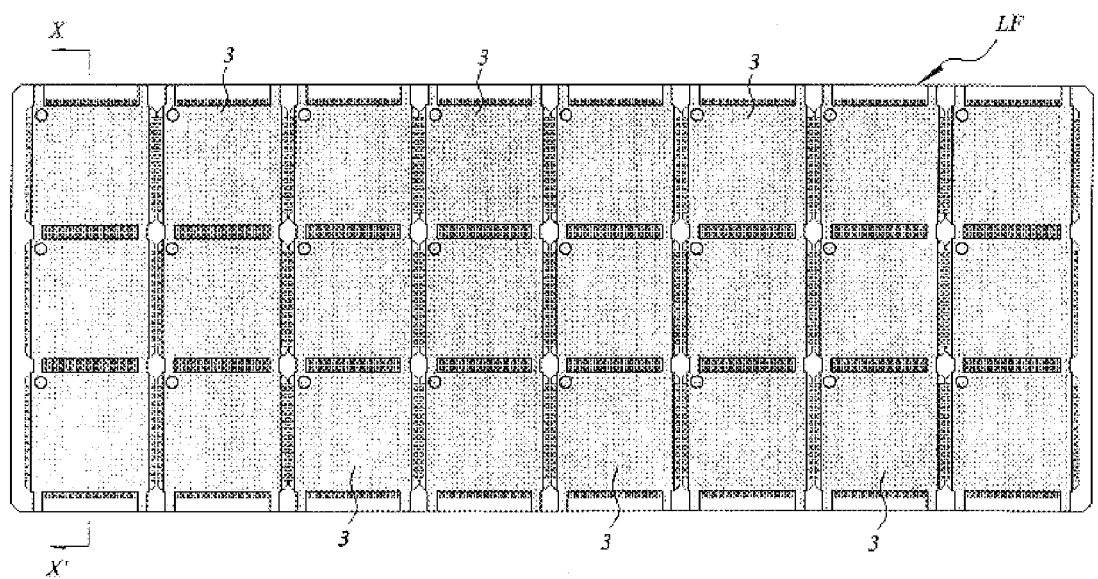
FIG. 21 is a plan view of the entire lead frame, which illustrates a manufacturing method of a semiconductor device that is an embodiment of the present invention.
Figure 22:
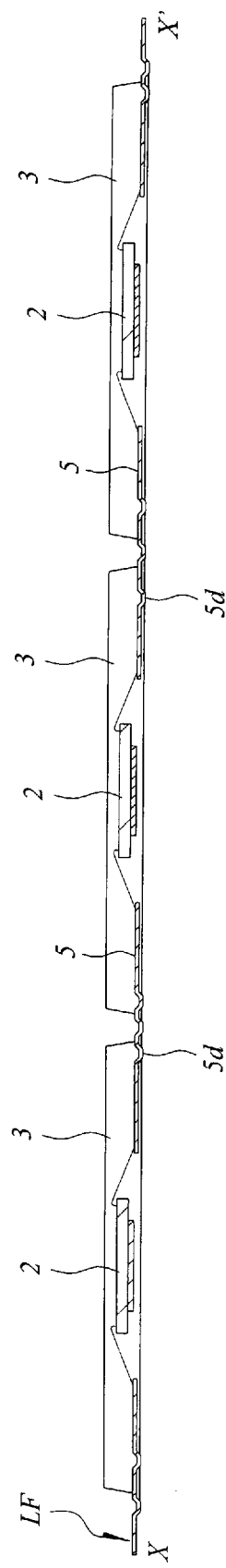
FIG. 22 is a cross-sectional view of a lead frame taken along the line X-X' in FIG. 21.
Figure 23:
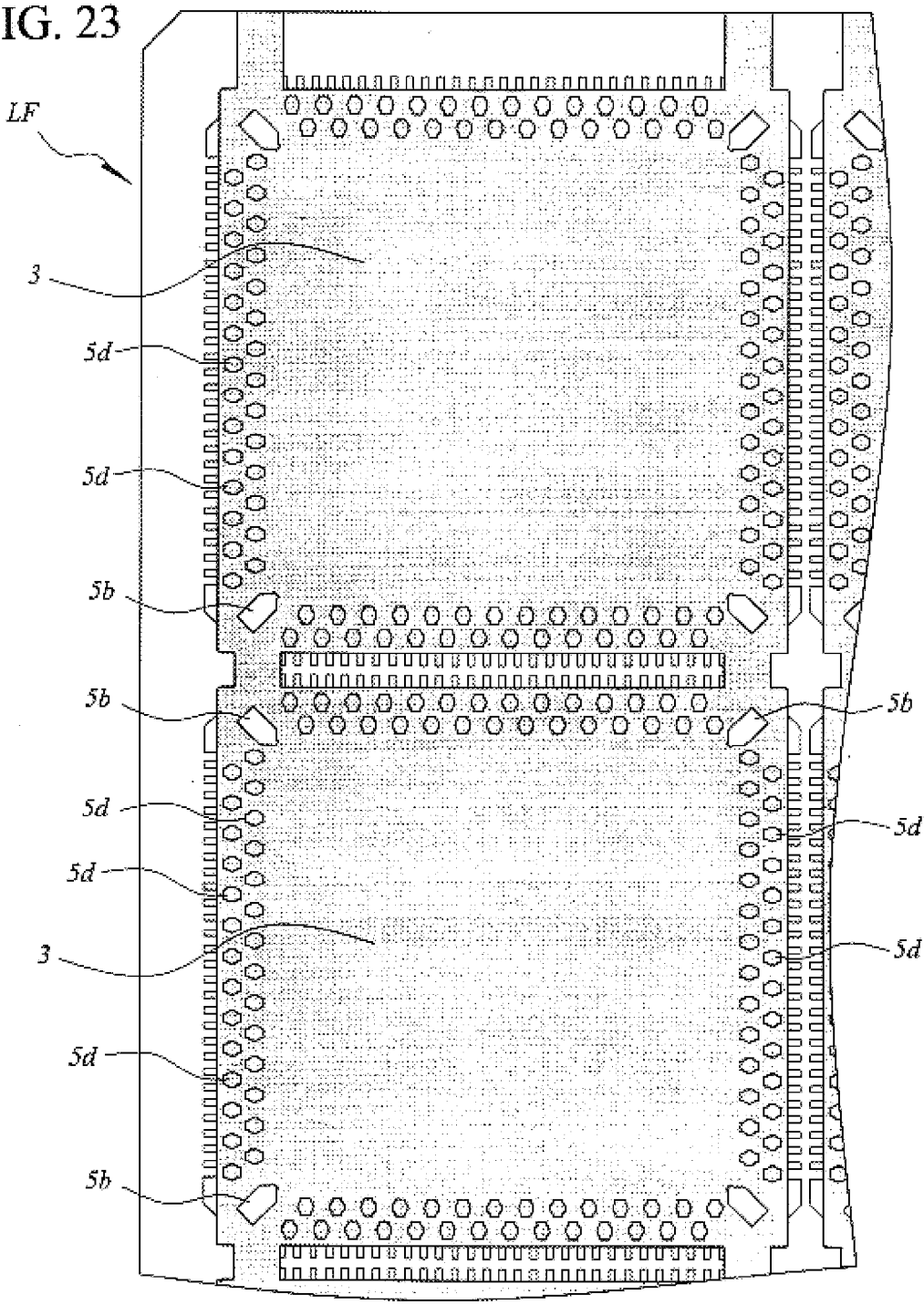
FIG. 23 is a plan view of the principal part of a lead frame, which illustrates a manufacturing method of a semiconductor device that is an embodiment of the present invention.

FIG. 21 is a plan view showing the entire surface side of the lead frame LF separated from the molding die 40. FIG. 22 is a cross-sectional view taken along the line X-X' in FIG. 21. FIG. 23 is a plan view showing the part of the rear surface side of the lead frame LF. As shown in FIG. 23, when the lead frame LF is separated from the molding die 40, the terminals 5d and the tip portions of the die pad supports 5b pressed into the resin film 41 in the above-described molding process are exposed from the rear surface of the plastic package 3 to the outside. At this time, the respective protrusive amounts of the terminals 5d and the die pad supports 5b protruding from the rear surface of the plastic package 3 are the same as the amounts pressed into the resin film 41 (about 10 to 30 μm).

Figure 24:
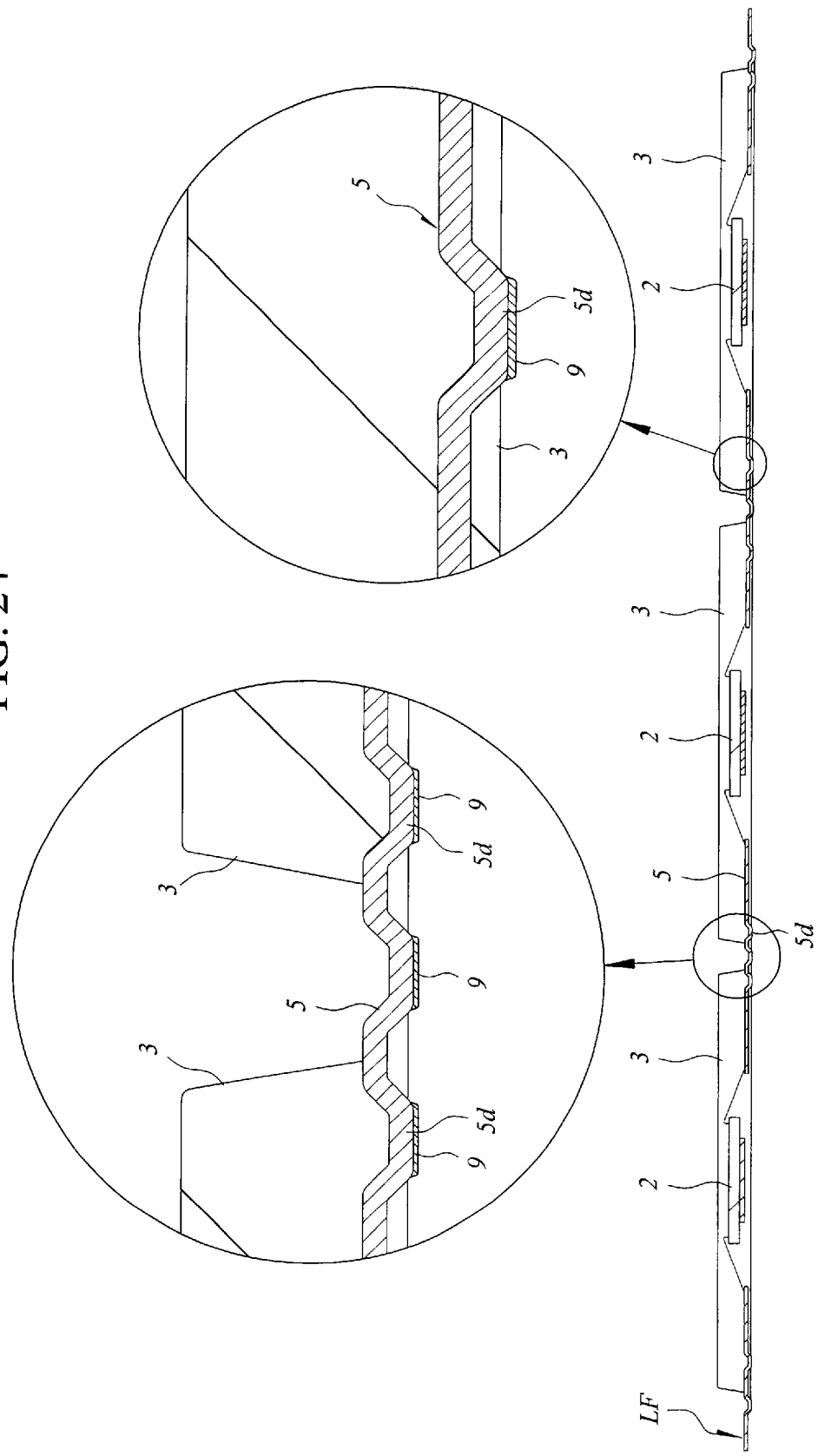
FIG. 24 is a cross-sectional view of the principal part of a lead frame, which illustrates a manufacturing method of a semiconductor device that is an embodiment of the present invention.

Next, the solder layer 9 is formed on the surface of each terminal 5d exposed from the rear surface of the plastic package 3 as shown in FIG. 24. Although not shown in the drawings, at this time the solder layer 9 is formed also on the surface of each die pad support 5b exposed from the rear surface of the plastic package 3. An electroplating method or a printing method is available to form the solder layer 9. However, a solder printing method is preferable because it can form a thick solder layer 9 in a short time. In the case of using the solder printing method, solder with a thickness of about 30 to 100 μm is printed by the screen printing method using a metal mask, and then the lead frame LF is heated in a heating furnace to reflow the solder.

Since the solder printing method is used to form the solder layer 9, it is possible to ensure that a total thickness of the solder layer 9 and the terminal 5d (and die pad supports 5b) protruded from the rear surface of the plastic package 3, namely, the standoff amount is 50 μm or more. In addition, in the case of using the plating method to form the solder layer 9, a Cu plate layer is formed as a base layer on each surface of the terminals 5d and the die pad supports 5b, and the solder plate layer with a thickness of about 10 to 20 μm is formed thereon. In this case, the amount of the push of the terminal 5d and the die pad support 5b into the resin film 41 is set to about 30 to 50 μm, whereby the standoff amount of 50 μm or more is ensured.

Thereafter, although not shown in the drawings, marks such as product names and the like are printed on the surface of the plastic package 3, and then the connection portions of the leads 5 exposed to the outside of the plastic package 3 are cut by a dicing and a die punch to obtain pieces of the plastic package 3, whereby the QFN 1 of the present embodiment shown in FIGS. 1 to 5 is completed.

The QFN 1 in this embodiment is mounted, by soldering the respective other tip portions of the plurality of terminals 5d and the die pad supports 5b exposed from the rear surface of the plastic package 3 to the outside, on the electrodes (footprint) of the wiring board.

As described above, in this embodiment, the patterns such as the leads 5, the die pad supports 5b, the die pads 4, the terminals 5d, etc. are formed by the pressing, the manufacturing process of the lead frame LF can be simplified in comparison to the case where etching is used to form the patterns. Therefore, the manufacturing cost thereof can be reduced and so the manufacturing cost of the QFN 1 by the use of the lead frame LF can be reduced.

In addition, according to the present embodiment, since the bending amount of each lead 5 is almost equivalent to the thickness of the metal sheet 10 (100 to 150 μm), the protrusive amount of the external connection terminal 5d exposed from the rear surface of the plastic package 3 can be easily increased by increasing the amount of the pressing thereof into the resin film 41. Therefore, it is possible to realize the standoff amount of 50 μm or more, which is the total thickness of it and the solder layer 9 formed on the surface of the terminal 5d, and also to easily control the increase and/or decrease in the standoff amount.

Thus, even where the size of the plastic package 3 is increased with the increase of the number of pins used in the QFN 1 and where the warp amount of the plastic package 3 is increased due to a temperature cycle after mounting the package on the wiring board, it is possible to suppress a reduction in the lifetime of the connections between the electrodes (footprint) of the wiring board and the terminals 5d, thereby realizing the QFN 1 with high mounting reliability in spite of having a large number of pins. Also, according to the present embodiment, since the other tip portions of the die pad supports 5b are soldered to the electrodes (footprint) in mounting the QFN 1 to the wiring board, the warp of the plastic package 3 is reduced and, at the same time, the heat radiation characteristics thereof are also improved. Therefore, the mounting reliability of the QFN 1 is further improved.

Also, in the QFN 1 according to the present embodiment, the lead tip 5a on one side of the lead 5 is extended to a position close to the die pad 4. Therefore, it is possible to reduce the length between the lead tip 5a on one side and the semiconductor die 2 and also reduce the length of the gold wire 6 used to connect them to each other. Also, even if the terminals 5d are arranged in a zigzag pattern, the lengths of the lead tips 5a on one side of the leads 5 are almost equal to one another and so the edge portions of the lead tips 5a on one side are arranged substantially in a row relative to each side of the semiconductor die 2. Accordingly, it is possible to make almost uniform the lengths of the gold wires 6 for connecting the lead tips 5a on one side of the leads 5 and the semiconductor die 2, and to make almost uniform the loop form of the gold wires 6.

As a result, there occurs no defect of the fact that the adjoining gold wires 6 are short-circuited, particularly, that the adjoining gold wires 6 are crossed to each other in the vicinity of the four corners of the semiconductor die 2. Therefore, the workability in the wire bonding process can be improved. In addition, since the intervals between the adjoining gold wires 6 can be reduced, the number of pins used in the QFN 1 can be increased.

Also, since the lead tip 5a on one side of the lead 5 is extended to a position close to the die pad 4, the length from the terminal 5d to the lead tip 5a on one side of the lead 5 is increased. Therefore, since moisture getting into the plastic package 3 through the terminals 5d exposed to the outside of the plastic package 3 cannot easily reach the semiconductor die 2, corrosion of the bonding pads 7 due to the moisture can be prevented. As a result, the reliability of the QFN 1 is improved.

Also, even if the semiconductor die 2 is shrunk by extending the lead tip 5a on one side of the lead 5 to a position close to the die pad 4, the increase in length of the gold wires 6 is extremely small (for example, even if the semiconductor die 2 is shrunk from 4 mm square to 3 mm square, the increase in length of each gold wire 6 is about 0.7 mm on average). Therefore, it is possible to prevent the deterioration of the workability in the wire bonding process, which is caused from the shrinkage of the semiconductor die 2.

Embodiment 2

Figure 25:
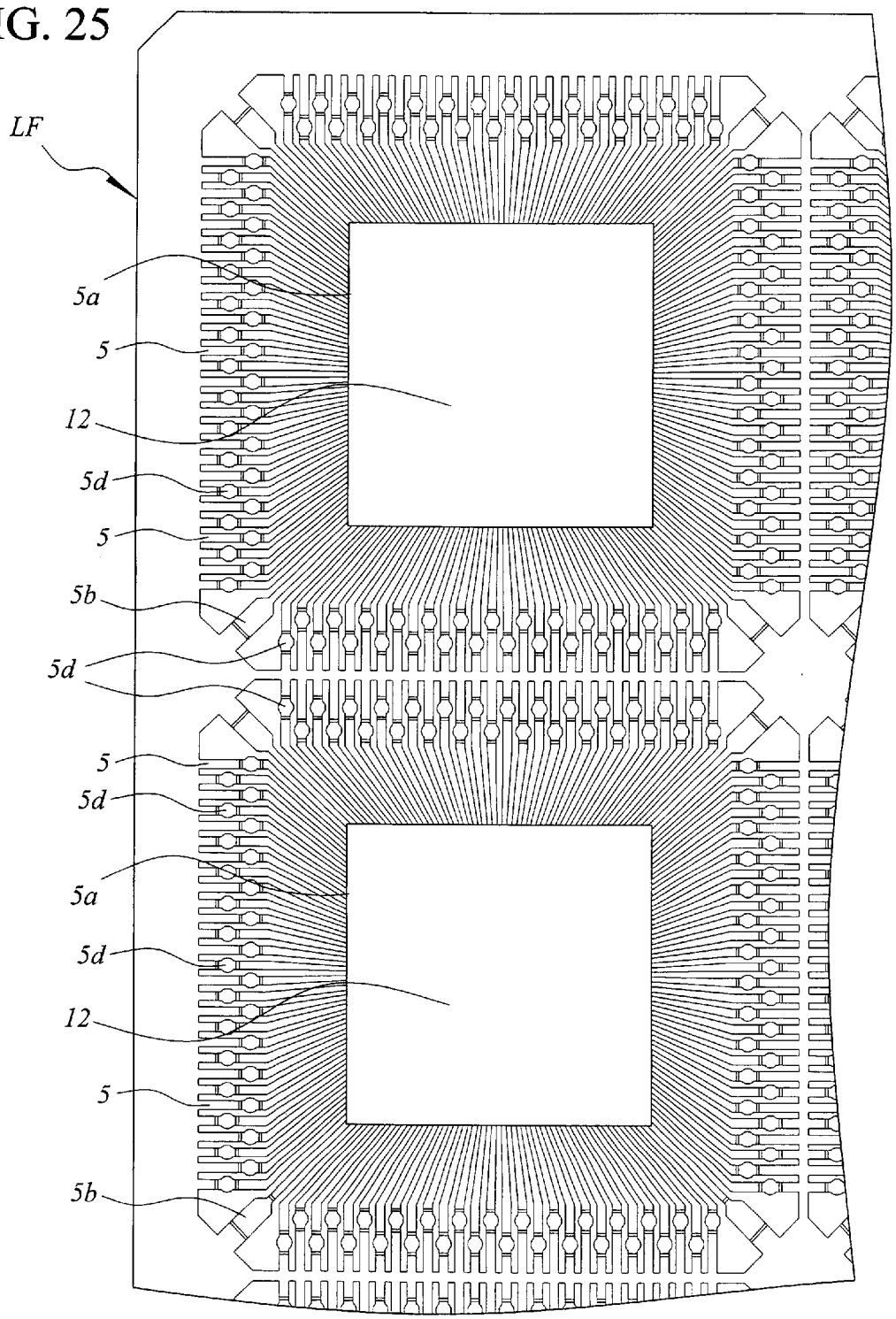
FIG. 25 is a plan view of the principal part of a lead frame used in the manufacture of a semiconductor device that is another embodiment of the present invention.

The QFN 1 manufactured by the use of the lead frame LF having the small tab structure has been described in Embodiment 1. However, for example, as shown in FIG. 25, a lead frame LF may be used, in which a sheet-like die support 12 formed of an insulating film is arranged on a die mounting region and the die support 12 is adhered and held by tip portions of the plurality of leads 5.

Figure 26:
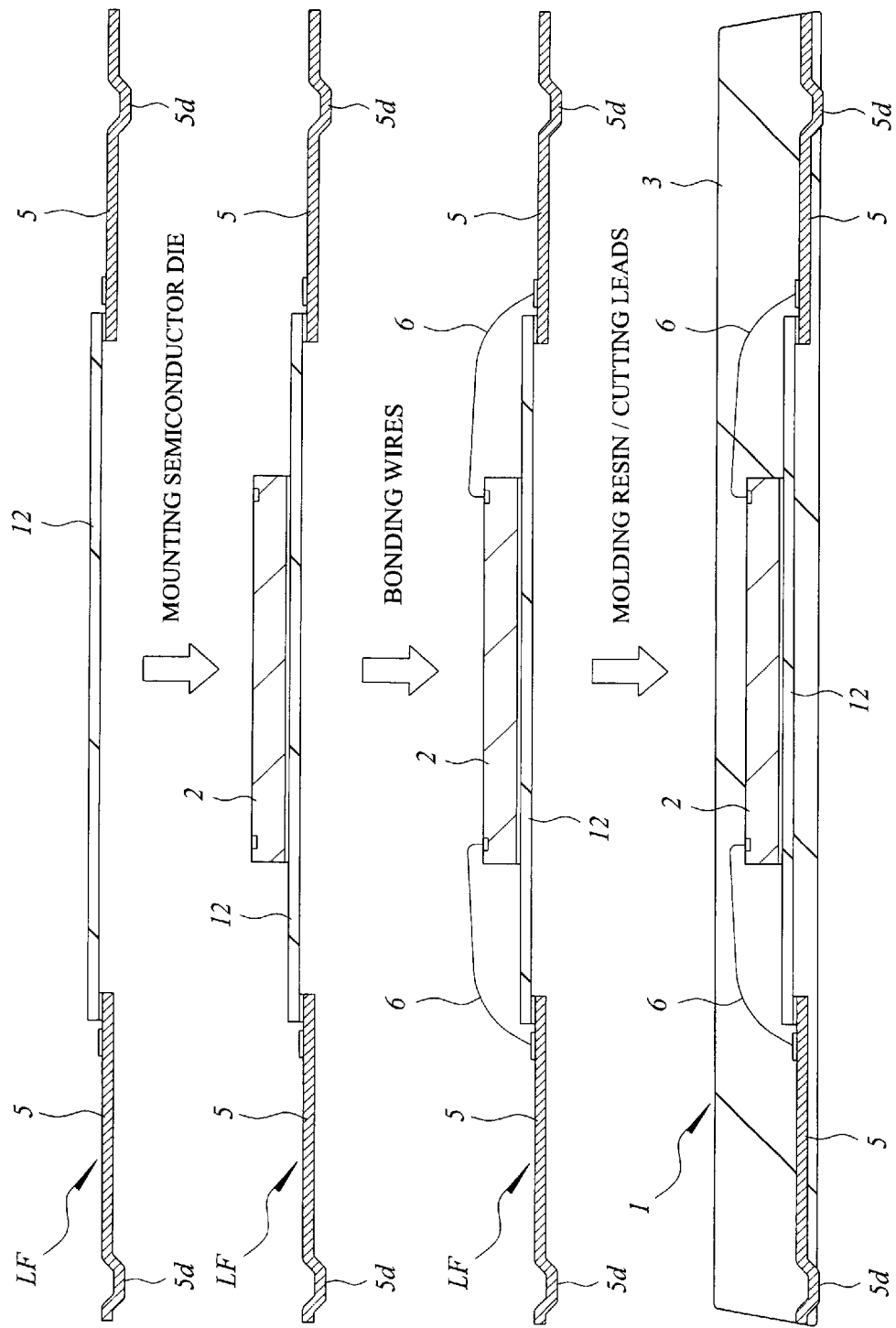
FIG. 26 is a cross-sectional view of the principal part of a lead frame, which illustrates a manufacturing method of a semiconductor device that is another embodiment of the present invention.

As shown in FIG. 26, the manufacturing method of the QFN 1 by the use of the above-described lead frame LF is almost the same as that explained in Embodiment 1 described above. Note that the die support 12 by the use of a conductive material such as a thin metal film may be constituted instead of the insulating film. In this case, in order to prevent the short circuit between the leads 5, it is preferable to use an insulative adhesive to adhere the die support 12 and the leads 5. It is also possible to constitute the die support 12 by the use of a film obtained by coating an insulative resin on a surface of a metal foil.

Figure 27:
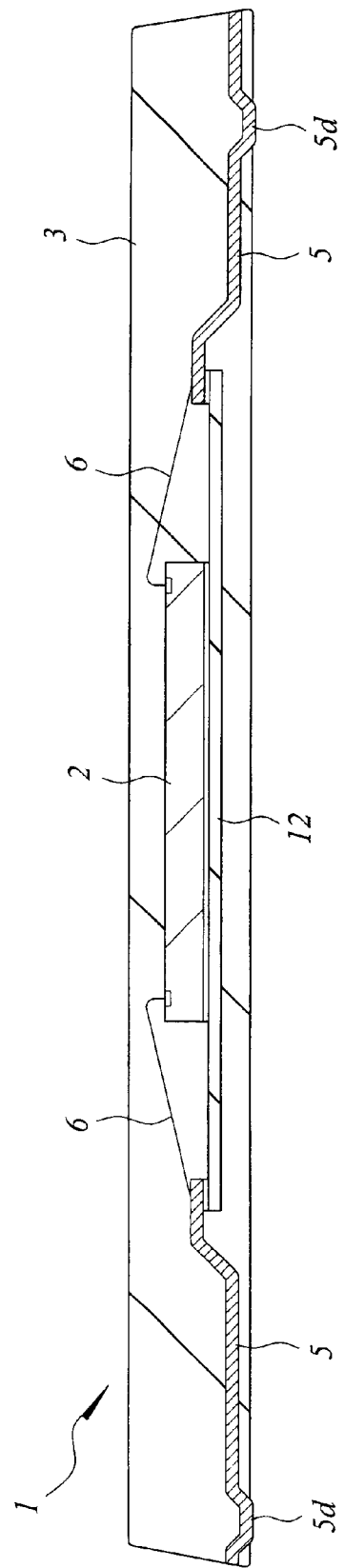
FIG. 27 is a cross-sectional view of the principal part of a semiconductor device that is another embodiment of the present invention.

Note that FIG. 26 shows an example in which the die support 12 is adhered to the upper surfaces of the leads 5. However, for example, it is also possible to adhere the die support 12 on the lower surfaces of the leads 5, as shown in FIG. 27. In this case, the height of the semiconductor die 2 is adjusted by bending upward the part near each tip portion of the leads 5.

Different from the lead frame LF used in Embodiment 1, the die pad supports 5b for supporting the die pad 4 are unnecessary in the lead frame LF using the above-described die support 12. Therefore, it is possible to allow a margin for the interval between the tip portions of the leads 5. In addition, the die support 12 can be supported more surely than the case where the die pad 4 is supported by the die pad supports 5b. Therefore, it is possible to suppress the displacement of the die support 12 and to prevent the short circuit between the gold wires 6, in injecting a molten resin into the molding die during the molding process.

In the foregoing, the invention made by the present inventor(s) has been described in detail based on the embodiments. However, it goes without saying that the present invention is not limited to the above-described embodiments and can be variously changed and modified without departing from the spirit and scope thereof.

Figure 28:
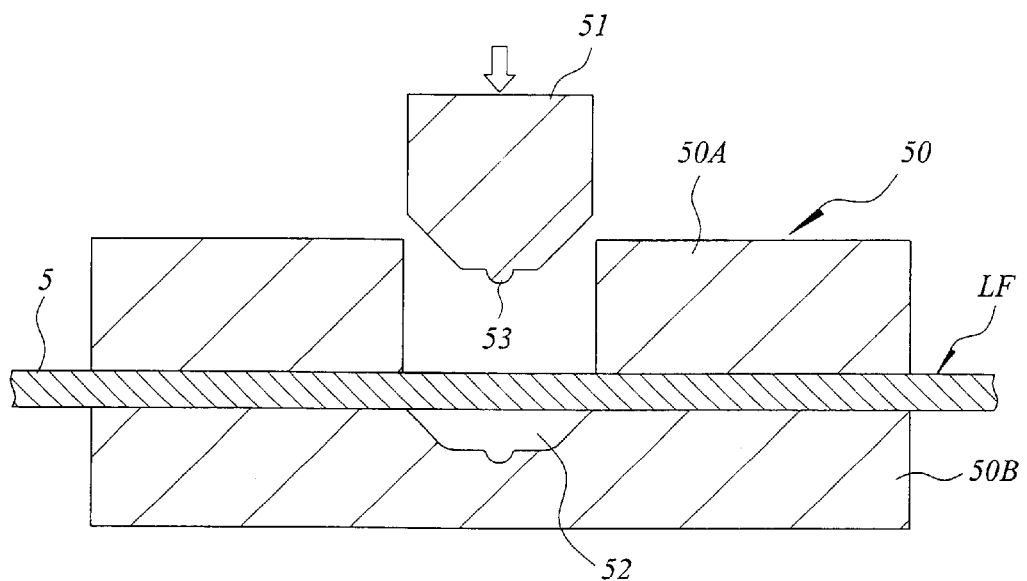
FIG. 28 is a cross-sectional view of the principal parts of a press die and a lead frame, which illustrates a manufacturing method of a semiconductor device that is another embodiment of the present invention.
Figure 29:
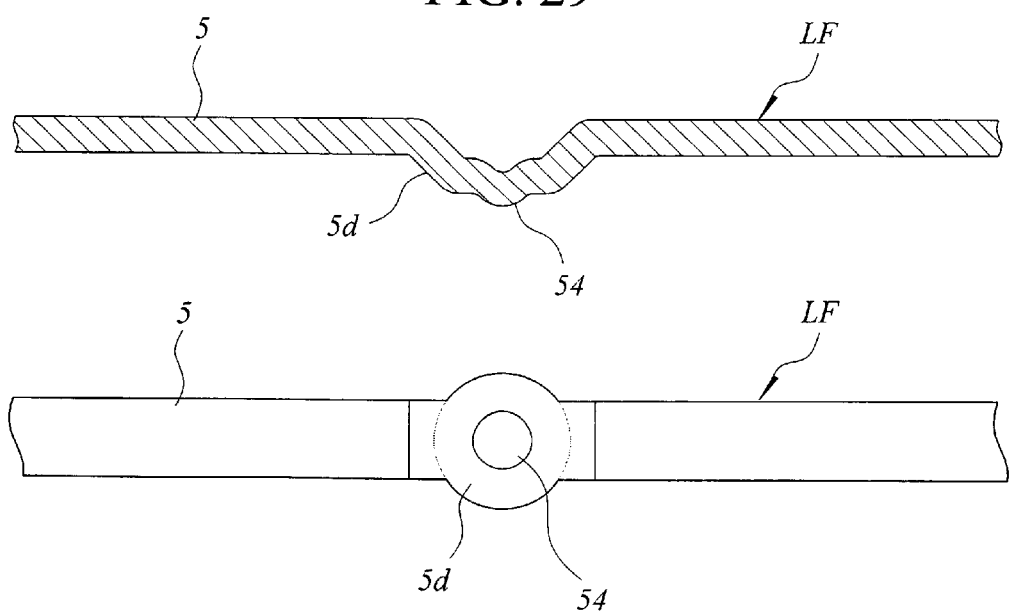
FIG. 29 is a cross-sectional view of the principal part of a lead frame, which illustrates a manufacturing method of a semiconductor device that is another embodiment of the present invention.

Each shape of the external connection terminals 5*d* of the QFN is not limited to that described in the embodiments. For example, when a punch 51 having a protrusion 53 on its tip is used to bend the lead 5 as shown in FIG. 28, a convex portion 54 corresponding to the shape of the protrusion 53 is formed on the lower surface of the terminal 5*d* as shown in FIG. 29. In the case of providing such convex portion 54 on the lower surface of the terminal 5*d*, the lower surface of the terminal 5*d* is more deeply pressed into the resin film 41 when the lead frame LF is mounted on the molding die 40 shown in FIG. 15. Therefore, it becomes possible to increase the standoff amount of the terminal 5*d* protruded from the rear surface of the plastic package 3 and so to realize the QFN having more improved connection reliability.

Also, the terminal 5 can have various kinds of plane shapes such as square or the like. Further, in the case where the number of terminals used in the QFN is relatively small, the width of the lead 5 is larger than that in case where the number of pins used in the QFN is large. Therefore, the width of the terminal 5*d* may be made equal to that of the lead 5.

The advantages achieved by the typical ones of the inventions disclosed in the present application will be briefly described as follows.

Since obtain the standoff amount of the external connection terminal can be sufficiently ensured, the QFN having a large number of pins and with high mounting reliability can be realized. Also, the use of a lead frame, having patterns such as leads, die pad supports, die pads, terminals, etc. formed by the pressing, can reduce the manufacturing cost of the QFN.

What is claimed is:

1. A method of manufacturing a semiconductor device having: a semiconductor die; a die pad on which said semiconductor die is mounted; a plurality of leads arranged around said semiconductor die; a plurality of wires for electrically connecting said semiconductor die and said leads; and a plastic package for encapsulating said semiconductor die, said die pad, said plurality of leads, and said plurality of wires, the method comprising the steps of:

(a) press-molding a metal sheet to prepare a lead frame on which a pattern including said die pad and said plurality of leads is repeatedly formed and a terminal is formed on a surface of each of said plurality of leads so as to protrude in a direction perpendicular to said surface;

(b) mounting said semiconductor die, on said die pad formed on said lead frame, and connecting said semiconductor die and respective parts of said leads by wires;

(c) preparing a molding die having an upper die and a lower die, coating a surface of said lower die with a resin film, then mounting said lead frame on said resin film, and thereby contacting said resin film with said terminal formed on each surface of said leads;

(d) sandwiching said resin film and said lead frame between said upper die and said lower die to push a tip portion of said terminal into said resin film;

(e) injecting a resin into a gap between said upper die and said lower die to form a plurality of plastic packages, in which said semiconductor die, said die pad, said leads, and said wires are encapsulated and said terminal protrudes to the outside, and thereafter separating said lead frame from said molding die; and (f) cutting said lead frame to obtain pieces of said plurality of plastic packages.

2. The method of manufacturing the semiconductor device according to claim 1, wherein, after said step (e), the method further comprises the step of forming a solder layer on a surface of said terminal exposed to each outside of said plastic packages by a printing method or a plating method.

3. The method of manufacturing the semiconductor device according to claim 1, wherein said plurality of leads are formed so that intervals between lead tips on one side near said die pad are narrower than those between lead tips on the other side opposite to said one side.

4. The method of manufacturing the semiconductor device according to claim 1, wherein said terminal is arranged two lines in a zigzag pattern along each side of said plastic package.

5. The method of manufacturing the semiconductor device according to claim 1, wherein a width of said terminal is made larger than that of each of said leads encapsulated in said plastic package.

6. A method of manufacturing a semiconductor device having: a semiconductor die; a sheet-shaped die support on which said semiconductor die is mounted; a plurality of leads arranged around said semiconductor die; a plurality of wires for electrically connecting said semiconductor die and said leads; and a plastic package for encapsulating said semiconductor die, said die support, said plurality of leads, and said plurality of wires, the method comprising the steps of:

(a) press-molding a metal sheet to prepare a lead frame on which a pattern including said plurality of leads is repeatedly formed and a terminal is formed on a surface of each of said plurality of leads so as to protrude in a direction perpendicular to said surface;

(b) attaching said sheet-shaped die support supported by said plurality of leads, onto a plurality of semiconductor-die mounting regions of said lead frame;

(c) mounting said semiconductor die on said die support, and connecting said semiconductor die and respective parts of said leads by wires;

(d) preparing a molding die having an upper die and a lower die, coating a surface of said lower die with a resin film, then mounting said lead frame on said resin film, and thereby contacting said resin film with said terminal formed on each surface of said leads;

(e) sandwiching said resin film and said lead frame between said upper die and said lower die to push a tip portion of said terminal into said resin film;

(f) injecting a resin into a gap between said upper die and said lower die to form a plurality of plastic packages in which said semiconductor die, said die support, said leads, and said wires are encapsulated and said terminal protrudes to the outside, and then separating said lead frame from said molding die; and (g) cutting said lead frame to obtain pieces of said plurality of plastic packages.

* * * * *